(12) United States Patent
Miyazawa

(10) Patent No.: US 10,008,835 B2
(45) Date of Patent: Jun. 26, 2018

(54) SEMICONDUCTOR APPARATUS

(71) Applicant: FUJI ELECTRIC CO., LTD., Kanagawa (JP)

(72) Inventor: Shigemi Miyazawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days. days.

(21) Appl. No.: 15/364,259

(22) Filed: Nov. 30, 2016

(65) Prior Publication Data

US 2017/0201075 A1 Jul. 13, 2017

(30) Foreign Application Priority Data

Jan. 12, 2016 (JP) .................................. 2016-003866

(51) Int. Cl.
*H01T 15/00* (2006.01)
*H01L 29/739* (2006.01)
*H01L 27/06* (2006.01)

(52) U.S. Cl.
CPC .......... *H01T 15/00* (2013.01); *H01L 27/0635* (2013.01); *H01L 29/7395* (2013.01)

(58) Field of Classification Search
None
See application file for complete search history.

(56) References Cited

U.S. PATENT DOCUMENTS

| 4,275,701 A * | 6/1981 | Arguello | F02P 3/0435 |
| | | | 123/146.5 A |
| 4,440,130 A * | 4/1984 | Taguchi | F02P 3/0453 |
| | | | 123/406.66 |
| 4,492,213 A * | 1/1985 | Yamamoto | F02P 3/051 |
| | | | 123/623 |
| 4,931,940 A * | 6/1990 | Ogawa | F02D 41/009 |
| | | | 701/101 |
| 5,603,308 A * | 2/1997 | Ooyabu | H03K 17/0406 |
| | | | 123/644 |
| 5,783,908 A * | 7/1998 | Toda | H05B 41/2921 |
| | | | 315/224 |
| 6,142,130 A * | 11/2000 | Ward | F02P 3/005 |
| | | | 123/606 |
| 6,539,929 B2 * | 4/2003 | Ito | F02P 3/053 |
| | | | 123/630 |

(Continued)

FOREIGN PATENT DOCUMENTS

JP 2008-45514 A 2/2008

*Primary Examiner* — Crystal L Hammond

(57) ABSTRACT

A semiconductor apparatus including a power semiconductor element connected between a first terminal on a high potential side and a second terminal on a low potential side, and controlled to be ON or OFF according to a gate potential thereof; a switch element connected between a control terminal that inputs a control signal for controlling the power semiconductor element and a gate of the power semiconductor element, and controlled to be ON or OFF according to a gate potential thereof; an ON potential supplying section connected between the first terminal and a gate of the switch element, that supplies an ON potential to the gate of the switch element; and an OFF potential supplying section connected between a reference potential and the gate of the switch element, that sets the gate potential of the switch element to an OFF potential in response to a predetermined cutoff condition being satisfied.

14 Claims, 14 Drawing Sheets

(56) References Cited

U.S. PATENT DOCUMENTS

| | | | | |
|---|---|---|---|---|
| 6,814,066 B2* | 11/2004 | Ando | ............... | F02P 3/0435 |
| | | | | 123/630 |
| 7,051,724 B2* | 5/2006 | Uruno | ............... | F02P 3/051 |
| | | | | 123/644 |
| 7,178,513 B2* | 2/2007 | Ward | ............... | F02P 3/04 |
| | | | | 123/634 |
| 7,301,129 B1* | 11/2007 | Yabe | ............... | H01L 27/0248 |
| | | | | 219/497 |
| 8,402,954 B2* | 3/2013 | Matsuda | ............... | F02P 9/005 |
| | | | | 123/143 B |
| 8,928,373 B2* | 1/2015 | Miyazawa | ............... | H03K 3/57 |
| | | | | 327/142 |
| 9,229,521 B2* | 1/2016 | Furuya | ............... | G06F 1/24 |
| 2004/0252432 A1* | 12/2004 | Sasaki | ............... | B60K 6/485 |
| | | | | 361/91.1 |
| 2006/0022609 A1* | 2/2006 | Yukutake | ............... | F02P 3/0552 |
| | | | | 315/209 T |
| 2006/0077000 A1* | 4/2006 | Goudo | ............... | H03K 17/08122 |
| | | | | 327/434 |
| 2009/0139505 A1* | 6/2009 | Naito | ............... | F02P 3/0552 |
| | | | | 123/644 |
| 2011/0031979 A1* | 2/2011 | Gillberg | ............... | F02P 3/0554 |
| | | | | 324/546 |
| 2012/0033341 A1 | 2/2012 | Miyazawa | | |
| 2013/0241609 A1* | 9/2013 | Miyazawa | ............... | H03K 3/57 |
| | | | | 327/142 |
| 2015/0048450 A1* | 2/2015 | Naito | ............... | H01L 29/402 |
| | | | | 257/337 |
| 2015/0171753 A1* | 6/2015 | Morimoto | ............... | H01H 47/32 |
| | | | | 323/271 |

* cited by examiner

SEMICONDUCTOR APPARATUS

The contents of the following Japanese patent application are incorporated herein by reference:
NO. 2016-003866 filed on Jan. 12, 2016.

BACKGROUND

1. Technical Field

The present invention relates to a semiconductor apparatus.

2. Related Art

A conventional power semiconductor device that handles a large amount of power is known to be used as a semiconductor apparatus for ignition in an internal combustion engine or the like. The circuit driving such a power semiconductor device includes a circuit that detects an abnormal state, such as the power semiconductor device being heated, and protects against any effects the abnormal state would have on the internal combustion engine, as shown in Patent Documents 1 to 3, for example.

Patent Document 1: Japanese Patent Application Publication No. 2008-45514
Patent Document 2: Japanese Patent Application Publication No. 2006-37822
Patent Document 3: Japanese Patent Application Publication No. 2012-36848

However, when forming such a one-chip ignitor, two different types of transistor elements, which are an N-channel MOSFET (Metal Oxide Semiconductor Field Effect Transistor) and a P-channel MOSFET, are formed on a semiconductor substrate, and this requires a complex manufacturing process and incurs a high cost. Accordingly, a one-chip ignitor is desired that can be formed by just N-channel MOSFETs while realizing reliable operation at a low cost and with a simple manufacturing process.

SUMMARY

Therefore, it is an object of an aspect of the innovations herein to provide a semiconductor apparatus, which is capable of overcoming the above drawbacks accompanying the related art. The above and other objects can be achieved by combinations described in the claims. According to a first aspect of the present invention, provided is a semiconductor apparatus comprising a power semiconductor element that is connected between a first terminal on a high potential side and a second terminal on a low potential side, and is controlled to be ON or OFF according to a gate potential thereof; a switch element that is connected between a control terminal that inputs a control signal for controlling the power semiconductor element and a gate of the power semiconductor element, and is controlled to be ON or OFF according to a gate potential thereof; an ON potential supplying section that is connected between the first terminal and a gate of the switch element, and supplies an ON potential to the gate of the switch element; and an OFF potential supplying section that is connected between a reference potential and the gate of the switch element, and sets the gate potential of the switch element to an OFF potential in response to a predetermined cutoff condition being satisfied.

According to a second aspect of the present invention, provided is a semiconductor apparatus comprising a power semiconductor element that is connected between a first terminal on a high potential side and a second terminal on a low potential side, and is controlled to be ON or OFF according to a gate potential thereof; a cutoff condition detecting section that detects whether a predetermined cutoff condition has been satisfied; a latch section that latches affirmative detection of the cutoff condition; and a cutoff section for setting a gate potential of the power semiconductor element to an OFF potential, in response to the latch section having latched the affirmative detection of the cutoff condition. The latch section receives a power source supply from the first terminal and holds a latched value.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
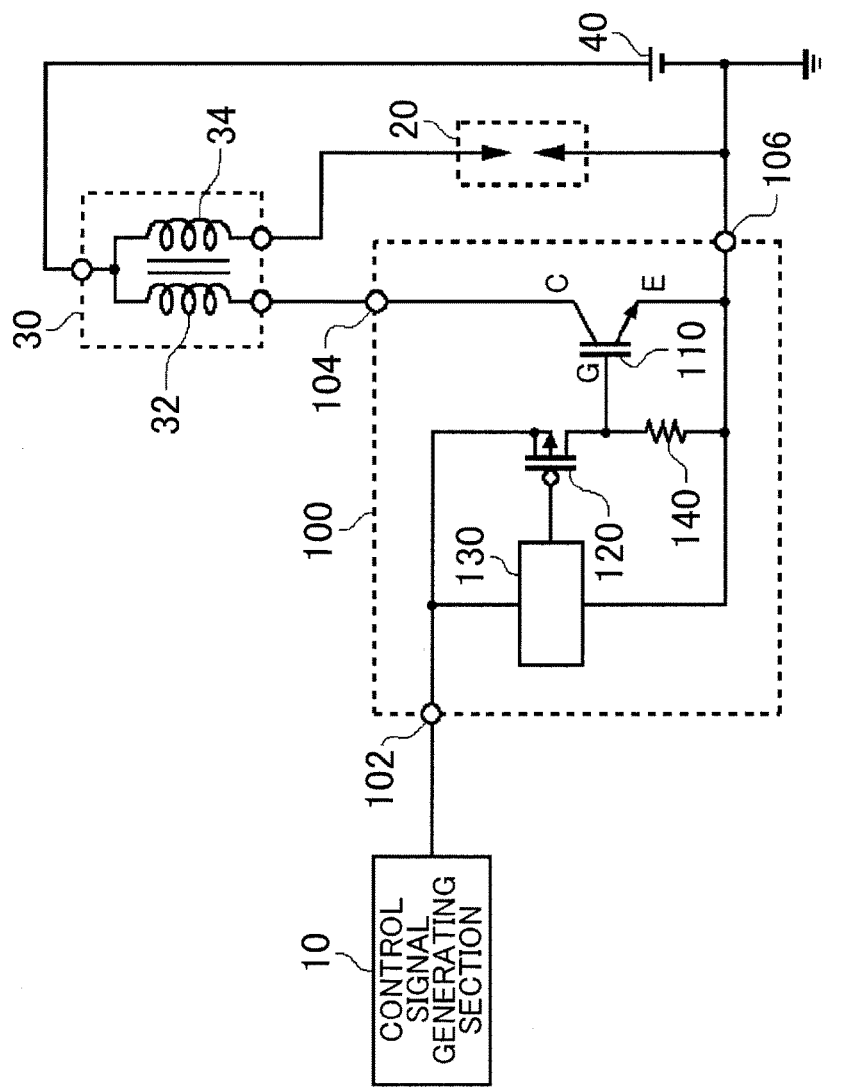
FIG. 1 shows an exemplary configuration of an ignition apparatus 1000 according to an embodiment.

FIG. 1 shows an exemplary configuration of an ignition apparatus 1000 according to an embodiment of the present invention. The ignition apparatus 1000 ignites an ignition plug used in an internal combustion engine or the like of an automobile or the like. The present embodiment is used to describe an example in which the ignition apparatus 1000 is mounted in the engine of an automobile. The ignition apparatus 1000 includes a control signal generating section 10, an ignition plug 20, an ignition coil 30, a power source 40, and a semiconductor apparatus 100.

The control signal generating section 10 generates a switching control signal that controls the ON and OFF switching of the semiconductor apparatus 100. The control signal generating section 10 is a portion of or all of an engine control unit (ECU) of the automobile in which the ignition apparatus 1000 is mounted, for example. The control signal generating section 10 supplies the semiconductor apparatus 100 with the generated switching control signal. As a result of the control signal generating section 10 supplying the semiconductor apparatus 100 with the switching control signal, the ignition apparatus 1000 begins the ignition plug 20 ignition operation.

The ignition plug 20 electrically creates a spark through electrical discharge. The ignition plug 20 performs the electrical discharge using an applied voltage greater than or equal to approximately 10 kV, for example. The ignition plug 20 is provided in an internal combustion engine, as one example, and in this case, ignites a combustion gas such as a mixed gas in a combustion chamber. The ignition plug 20 is provided in a through-hole that penetrates from outside of a cylinder to the combustion chamber inside the cylinder, and is secured by being sealed in the through-hole, for example. In this case, one end of the ignition plug 20 is exposed inside the combustion chamber, and the other end of the ignition plug 20 receives an electrical signal from outside the cylinder.

The ignition coil 30 supplies the electrical signal to the ignition plug. The ignition coil 30 supplies a high voltage causing the ignition plug 20 to discharge, as the electrical signal. The ignition coil 30 may function as a transformer, and is an ignition coil including a primary coil 32 and a secondary coil 34, for example. One end of the primary coil 32 and one end of the secondary coil 34 are electrically connected to each other. The primary coil 32 has a smaller number of windings than the secondary coil 34, and shares a core with the secondary coil 34. The secondary coil 34 generates electromotive force (mutual induced electromotive force) according to the electromotive force generated by the primary coil 32. The other end of the secondary coil 34 is connected to the ignition plug 20, and the secondary coil 34 supplies the ignition plug 20 with the generated electromotive force to cause a discharge.

The power source 40 supplies a voltage to the ignition coil 30. The power source 40 supplies a predetermined constant voltage Vb (14 V, for example) to the one end of the primary coil 32 and the one end of the secondary coil 34, for example. The power source 40 is a battery of the automobile, for example.

The semiconductor apparatus 100 switches whether there is conduction or no conduction between a reference potential and the other end of the primary coil 32 of the ignition coil 30, according to the switching control signal supplied from the control signal generating section 10. For example, the semiconductor apparatus 100 causes conduction between the reference potential and the primary coil 32 in response to the switching control signal having a high potential (ON potential), and causes no conduction between the reference potential and the primary coil 32 in response to the switching control signal having a low potential (OFF potential). Here, the reference potential may be a reference potential of a control system of the automobile, or may be a reference potential corresponding to the semiconductor apparatus 100 in the automobile. The reference potential may have a low potential to turn OFF the semiconductor apparatus 100, and this low potential is 0 V, for example. The semiconductor apparatus 100 includes a control terminal 102, a first terminal 104, a second terminal 106, a power semiconductor element 110, a switch element 120, a cutoff signal source 130, and a discharge circuit 140.

The control terminal 102 inputs a control signal for controlling the power semiconductor element 110. The control terminal 102 is connected to the control signal generating section 10, and receives the switching control signal. The first terminal 104 is connected to the power source 40 via the ignition coil 30. The second terminal 106 is connected to the reference potential. In other words, the first terminal 104 is a terminal on a high potential side compared to the second terminal 106, and the second terminal 106 is a terminal on a low potential side compared to the first terminal 104.

The power semiconductor element 110 includes a gate terminal (G), a collector terminal (C), and an emitter terminal (E), and creates an electrical connection or an electrical disconnection between the collector terminal and the emitter terminal according to the switching control signal input to the gate terminal. The power semiconductor element 110 is connected between the first terminal 104 on the high potential side and the second terminal 106 on the low potential side, and is controlled to be ON or OFF according to a gate potential. The power semiconductor element 110 is an insulated gate bipolar transistor (IGBT), for example. Instead, the power semiconductor element 110 may be a MOSFET. The emitter terminal of the power semiconductor element 110 is connected to the reference potential, for example. The collector terminal is connected to the other end of the primary coil 32. In the present embodiment, an example is described in which the power semiconductor element 110 is an n-channel IGBT that electrically connects the collector terminal and the emitter terminal in response to the control signal having the ON potential.

The switch element 120 is connected between the control terminal 102 and the gate terminal of the power semiconductor element 110. The switch element 120 may be a FET, and an ON/OFF state between the drain terminal and the source terminal is controlled according to the gate potential. The drain terminal of the switch element 120 is connected to the control terminal 102, the source terminal of the switch element 120 is connected to the gate terminal of the power semiconductor element 110, and the switch element 120 switches whether the switching control signal input from the control terminal 102 is supplied to the gate terminal of the power semiconductor element 110. The switch element 120 is a normally-ON switch element that causes an electrical disconnection between the drain terminal and the source terminal in response to the gate terminal having the ON potential (high potential), for example. In this case, the switch element 120 is preferably a p-channel MOSFET.

The cutoff signal source 130 generates a cutoff signal in response to a predetermined cutoff condition being satisfied, and supplies the cutoff signal to the gate terminal of the switch element 120. The cutoff signal source 130 is connected to a detection apparatus or the like that detects abnormal conduction, abnormal heating, or the like in the power semiconductor element 110, and determines that the cutoff condition has been satisfied in response to an abnormality being detected in the power semiconductor element 110. In other words, the cutoff signal source 130 cuts off the supply of the control signal to the power semiconductor element 110 from the control terminal 102, in response to an abnormality being detected in the power semiconductor element 110. The cutoff signal source 130 may generate the cutoff signal that transitions from a low potential to a high potential. In this way, the power semiconductor element 110 is switched to the OFF state. The cutoff signal source 130 is described further below.

The discharge circuit 140 is connected between the reference potential and the gate of the power semiconductor element 110, and discharges the charge accumulated in a capacitance component of the gate of the power semiconductor element 110. When the supply of the control signal from the control terminal 102 to the power semiconductor element 110 is cut off, the discharge circuit 140 causes the charge of the gate terminal to be discharged, thereby switching the power semiconductor element 110 to the OFF state. One end of the discharge circuit 140 is connected to the gate terminal of the power semiconductor element 110, and the other end of the discharge circuit 140 is connected to the reference potential. The discharge circuit 140 may cause the charge to be discharged according to a predetermined time constant. In other words, when the supply of the control signal to the power semiconductor element 110 is cut off, the discharge circuit 140 switches the power semiconductor element 110 to the OFF state before a predetermined time has passed. FIG. 1 shows an example in which the discharge circuit 140 is a resistance element. The discharge circuit 140 may have a capacitance component, an inductance component, and/or the like.

In the semiconductor apparatus 100 according to the present embodiment described above, the power semiconductor element 110 is in the ON state when the power semiconductor element 110 is in a normal state and the switching control signal is the high potential. In this way, a collector current Ic flows from the power source 40 via the primary coil 32 of the ignition coil 30. The change over time dIc/dt of the collector current Ic is determined according to the supply voltage of the power source 40 and the inductance of the primary coil 32, and the collector current Ic increases up to a predetermined (or set) current value. For example, the collector current Ic increases to a value of approximately several amperes, ten to twenty amperes, or tens of amperes.

When the switching control signal becomes the low potential, the power semiconductor element 110 enters the OFF state and the collector current decreases sharply. As a result of the sharp decrease of the collector current, the voltage across the primary coil 32 increases sharply due to the self-induced electromotive force, thereby causing an induced electromotive force reaching approximately tens of kV as the voltage across the secondary coil 34. The ignition apparatus 1000 causes the discharge of the ignition plug 20 and ignites the combustion gas by supplying such a voltage of the secondary coil 34 to the ignition plug 20.

Here, when abnormal conduction, abnormal heating, or the like occurs in the power semiconductor element 110, the cutoff signal source 130 cuts off the supply of the control signal from the control terminal 102 to the power semiconductor element 110. In this way, the discharge circuit 140 causes the charge of the gate terminal of the power semiconductor element 110 to be discharged according to a predetermined time constant, and therefore the gate potential of the power semiconductor element 110 gradually decreases. In accordance with the gate potential of the power semiconductor element 110 decreasing to a value less than or equal to the OFF potential, the collector current Ic also begins to decrease and ultimately reaches zero.

As described above, when an abnormality is detected in the power semiconductor element 110, the semiconductor apparatus 100 according to the present embodiment decreases the gate potential of the power semiconductor element 110 gradually over time to a degree where it is possible to prevent the ignition plug from discharging due to a sudden fluctuation in the collector current Ic. In this way, the semiconductor apparatus 100 can gently cut off the power semiconductor element 110 while preventing mistaken discharge of the ignition plug 20, in response to an abnormality in the power semiconductor element 110

In the present embodiment, the semiconductor apparatus 100 is described as an example in which the power semiconductor element 110 and the switch element 120 are MOS devices with different polarities. When such a semiconductor apparatus 100 is formed on a single substrate, this means that two different types of transistor elements, namely a p-channel type and an n-channel type, are formed on the substrate, and therefore the manufacturing process becomes complex and the cost is increased. With the semiconductor apparatus 200 according to the present embodiment, it is possible to realize the same operation as the semiconductor apparatus 100 described in FIG. 1, with a configuration that uses the same types of transistor elements. An ignition apparatus 2000 including such a semiconductor apparatus 200 is described using FIG. 2.

Figure 2:
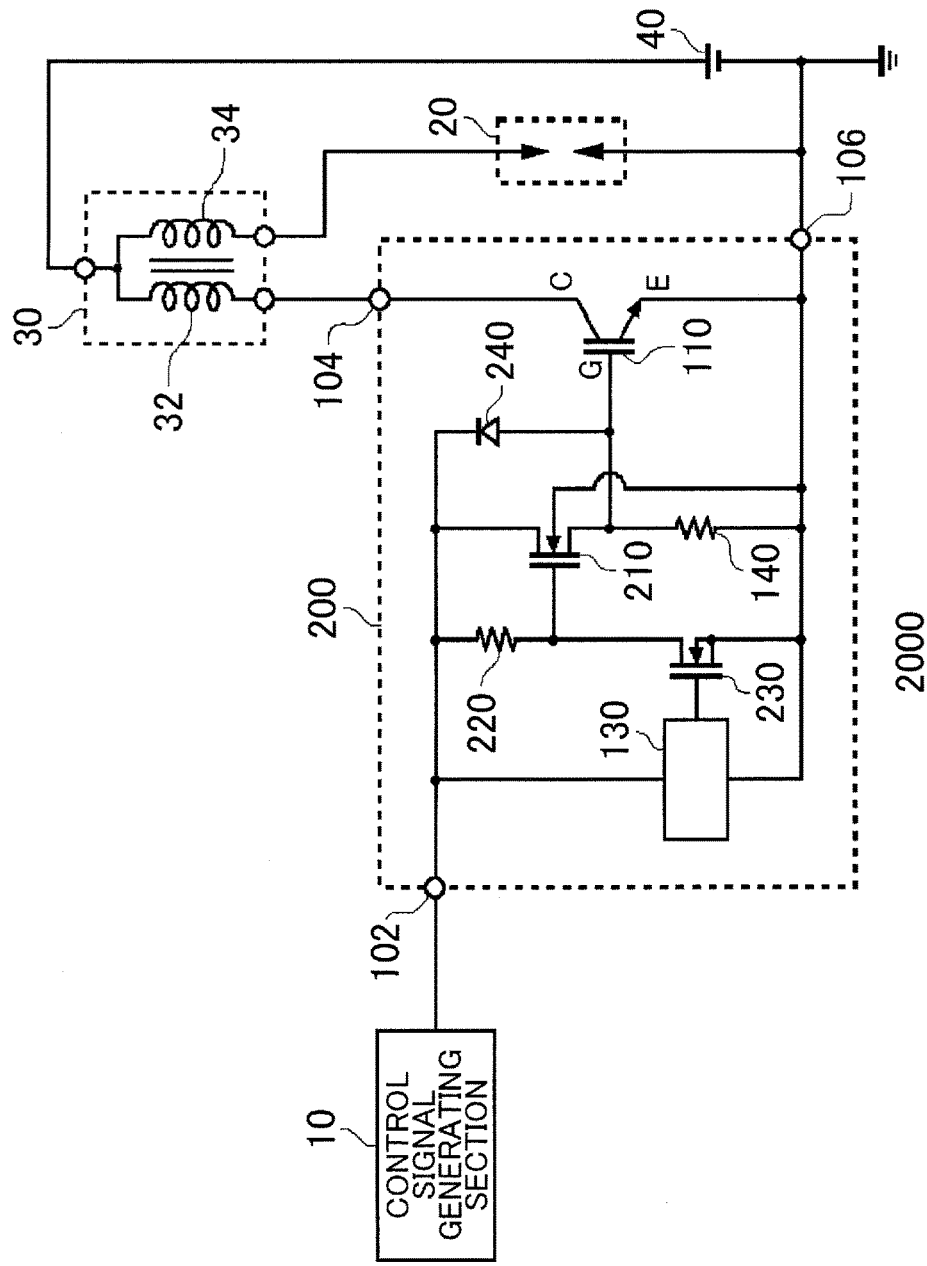
FIG. 2 shows an exemplary configuration of an ignition apparatus 2000 according to an embodiment.

FIG. 2 shows an exemplary configuration of the ignition apparatus 2000 according to the present embodiment. In the ignition apparatus 2000 shown in FIG. 2, components that have substantially the same operation as components of the ignition apparatus 1000 according to the embodiment shown in FIG. 1 are given the same reference numerals and descriptions thereof are omitted. The ignition apparatus 2000 includes a semiconductor apparatus 200. Descriptions of the control signal generating section 10, the ignition plug 20, the ignition coil 30, and the power source 40 included in the ignition apparatus 2000 are omitted.

The semiconductor apparatus 200 includes a switch element 210, a resistor 220, a potential switching section 230, and a rectifying element 240. Descriptions of the control terminal 102, the first terminal 104, the second terminal 106, the power semiconductor element 110, the cutoff signal source 130, and the discharge circuit 140 included in the semiconductor apparatus 200 are omitted.

In the same manner as the switch element 120 described in FIG. 1, the switch element 210 is connected between the gate of the power semiconductor element 110 and the control terminal 102 that inputs the control signal for controlling the power semiconductor element 110, and is controlled to be ON or OFF according to the gate potential. The switch element 210 creates an electrical connection between the drain terminal and the source terminal in response to the gate terminal being the ON potential (high potential).

As an example, when the switching control signal input from the control terminal 102 is the high potential, the switch element 210 supplies this switching control signal from the drain terminal to the gate terminal of the power semiconductor element 110. Furthermore, when the switching control signal is the low potential, the switch element 210 cuts off the supply of the switching control signal to the power semiconductor element 110. In other words, the switch element 210 is a normally-OFF switch element, and is an n-channel MOSFET that has the opposite polarity of the switch element 120 described in FIG. 1.

The resistor 220 is connected between the control terminal 102 and the gate terminal of the switch element 210.

When the power semiconductor element 110 is operating normally, the resistor 220 transmits the switching control signal input from the control terminal 102 to the gate terminal of the switch element 210. When an abnormality is detected in the power semiconductor element 110, even when the switching control signal input from the control terminal 102 is the ON potential, the resistor 220 causes a voltage drop in this ON potential.

The potential switching section 230 is connected between the reference potential and the gate terminal of the switch element 210, and switches the gate potential of the switch element 210 to the OFF potential in response to the cutoff signal from the cutoff signal source 130. The potential switching section 230 creates an electrical connection between the drain terminal and the source terminal in response to the cutoff signal being the high potential. In this way, the switching control signal input from the control terminal 102 is transmitted to the reference potential via the resistor 220 and the OFF potential is supplied to the gate terminal of the switch element 210. The potential switching section 230 may be a normally-OFF switch element that creates an electrical disconnection between the drain terminal and the source terminal in response to the cutoff signal being the low potential. In other words, the potential switching section 230 may be an n-channel MOSFET.

The rectifying element 240 is connected between the control terminal 102 and the gate terminal of the power semiconductor element 110. When the power semiconductor element 110 transitions to the OFF state, the rectifying element 240 causes the charge accumulated in the gate of the power semiconductor element 110 to flow to other circuits and the like. When the gate potential of the power semiconductor element 110 is greater than or equal to a threshold value of the rectifying element 240 while the power semiconductor element 110 is transitioning to the OFF state, the rectifying element 240 causes this charge to flow to the control signal generating section 10 and/or the cutoff signal source 130. When an abnormality is detected in the power semiconductor element 110, the rectifying element 240 may cause this charge to flow to the reference potential via the resistor 220. The rectifying element 240 is a diode, for example.

In the same manner as the semiconductor apparatus 100 described above in FIG. 1, the semiconductor apparatus 200 according to the present embodiment described above has the power semiconductor element 110 in the ON state when the power semiconductor element 110 is in a normal state and the switching control signal is the high potential. Therefore, as described in FIG. 1, the ignition apparatus 2000 can ignite the combustion gas by causing the ignition plug 20 to discharge.

Furthermore, when abnormal conduction, abnormal heating, or the like occurs in the power semiconductor element 110, the cutoff signal source 130 cuts off the supply of the control signal from the control terminal 102 to the power semiconductor element 110. In this way, as described in FIG. 1, the semiconductor apparatus 200 can gently cut off the power semiconductor element 110 while preventing mistaken discharge of the ignition plug 20.

In other words, the semiconductor apparatus 200 according to the present embodiment can use the power semiconductor element 110, the switch element 210, and the potential switching section 230 that are MOS devices having the same polarity to safely switch between having conduction and having no conduction between the reference potential and the other end of the primary coil 32 of the ignition coil 30. If such a semiconductor apparatus 200 is formed on one substrate, for example, the same type of MOS devices can be formed on this substrate as well, and therefore the manufacturing process becomes simpler. Furthermore, it is possible to perform at least a portion of the manufacturing process in common for MOS devices that are the same type, and therefore the manufacturing process can be made more efficient. Accordingly, the semiconductor apparatus 200 can operate as an ignitor used for ignition in an internal combustion engine or the like, and the cost can be reduced.

The switch element 210 that is an n-channel device is an enhancement device that is in the ON state when the gate-source potential exceeds a threshold value Vth. Here, in the ON state, the gate potential and the drain potential of the switch element 210 are the ON potential of the switching control signal input from the control terminal 102. Accordingly, the source potential of the switch element 210 is smaller than the ON potential of the switching control signal by the threshold value Vth (e.g. 1 V), and this reduced switching control signal is supplied to the power semiconductor element 110.

In this way, the potential for controlling the power semiconductor element 110 becomes smaller, and therefore there have been cases where the operation of the power semiconductor element 110 becomes unstable. Furthermore, if a correction circuit or the like is further included in order to compensate for this reduced control potential, there have been cases where the circuit size and the chip size undesirably increase. In this case as well, a semiconductor apparatus 300 according to an embodiment of the present invention has a configuration using the same type of transistor elements and operates in the same manner as the semiconductor apparatus 100 described in FIG. 1, without reducing the switching control signal. An ignition apparatus 3000 including such a semiconductor apparatus 300 is described using FIG. 3.

Figure 3:
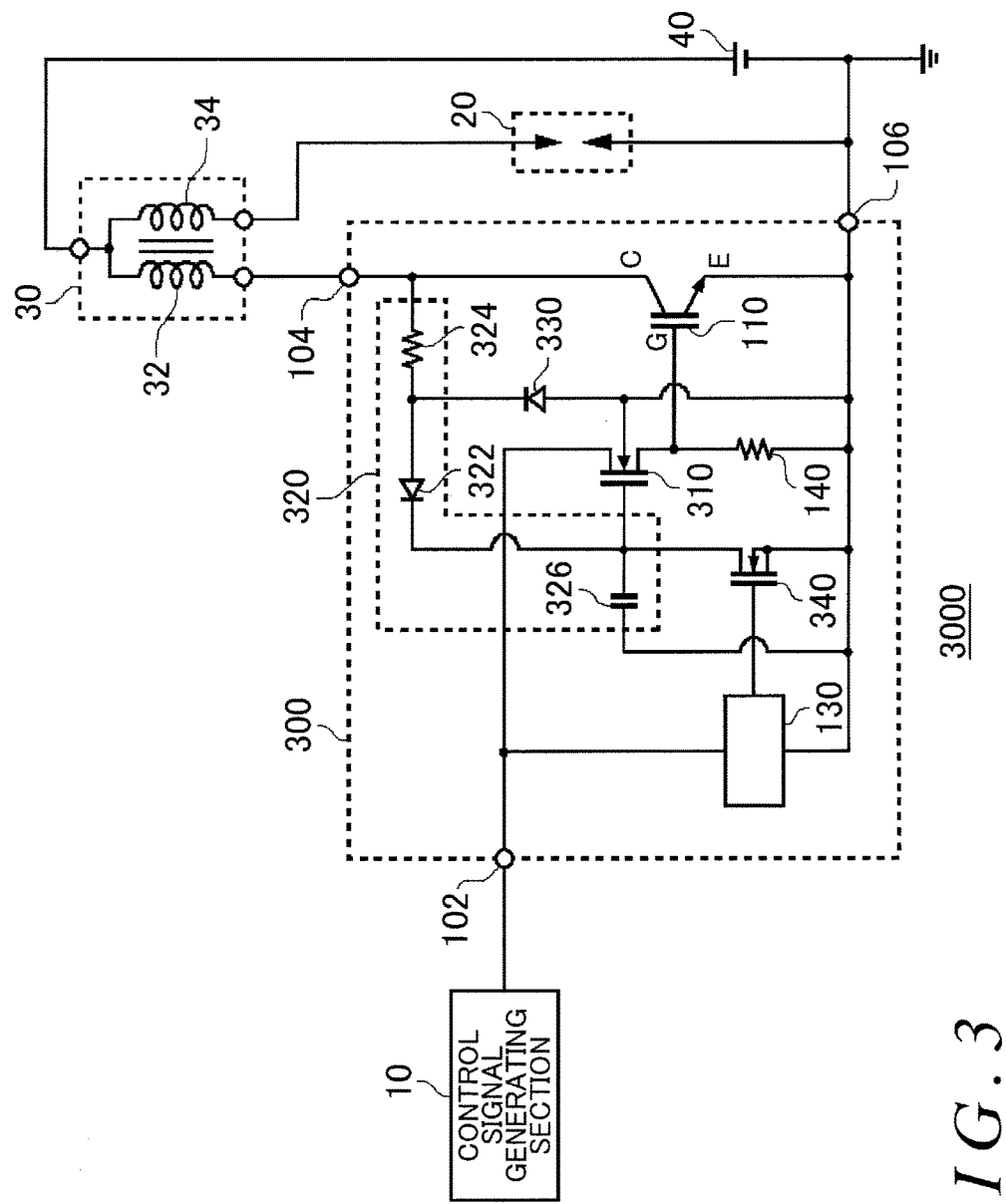
FIG. 3 shows an exemplary configuration of an ignition apparatus 3000 according to an embodiment.

FIG. 3 shows an exemplary configuration of the ignition apparatus 3000 according to the present embodiment. In the ignition apparatus 3000 shown in FIG. 3, components that have substantially the same operation as components of the ignition apparatus 1000 and the ignition apparatus 2000 according to the embodiments shown in FIGS. 1 and 2 are given the same reference numerals and descriptions thereof are omitted. The ignition apparatus 3000 includes the semiconductor apparatus 300. Descriptions of the control signal generating section 10, the ignition plug 20, the ignition coil 30, and the power source 40 included in the ignition apparatus 3000 are omitted.

The semiconductor apparatus 300 includes a switch element 310, an ON potential supplying section 320, a rectifying element 330, and an OFF potential supplying section 340. Descriptions of the control terminal 102, the first terminal 104, the second terminal 106, the power semiconductor element 110, the cutoff signal source 130, and the discharge circuit 140 included in the semiconductor apparatus 300 are omitted.

The connection in the gate electrode in the switch element 310 differs from that of the switch element 210 described in FIG. 2, but the switch element 310 and the switch element 210 operate in substantially the same manner. Specifically, the switch element 310 is connected between the gate of the power semiconductor element 110 and the control terminal 102 that inputs the control signal for controlling the power semiconductor element 110, and is controlled to be ON or OFF according to the gate potential. In the same manner as the switch element 210 described in FIG. 2, the switch element 310 is a normally-OFF switch element, and may be an n-channel MOSFET.

The ON potential supplying section 320 is connected between the first terminal 104 and the gate of the switch element 310, and supplies the ON potential to the gate of the switch element 310. The ON potential supplying section 320 supplies the gate of the switch element 310 with the collector potential (the collector-emitter potential) of the power semiconductor element 110, and pulls up the gate of the switch element 310. The ON potential supplying section 320 includes a pullup circuit that pulls up the gate of the switch element 310 using the voltage from the first terminal 104, and a capacitor 326 that is provided between the gate of the switch element 310 and the reference potential.

The pullup circuit includes a rectifying element 322 connected between the first terminal 104 and the gate of the switch element 310, and a resistor 324. The rectifying element 322 is connected to the gate terminal of the switch element 310, and prevents the flow of current from the gate terminal of the switch element 310 to the first terminal 104. Even when the power semiconductor element 110 enters the ON state and the collector potential drops to approximately 0.6 V, for example, the rectifying element 322 prevents current from flowing from the gate terminal of the switch element 310 to the collector electrode of the power semiconductor element 110. In other words, the rectifying element 322 operates in a manner to maintain the gate potential of the switch element 310 even when the collector potential of the power semiconductor element 110 drops. The rectifying element 322 is a diode, for example.

The resistor 324 is connected serially with the rectifying element 322 on the first terminal 104 side of the rectifying element 322, between the first terminal 104 and the gate of the switch element 310. The resistor 324 limits the current input to the ON potential supplying section 320 from the first terminal 104 side. For example, even when the collector potential of the power semiconductor element 110 increases to approximately 40 V, the resistor 324 operates as a protective resistor that reduces the current input to the ON potential supplying section 320 from the first terminal 104 side.

The capacitor 326 is provided between the gate terminal of the switch element 310 and the reference potential, and holds the potential resulting from the pullup circuit pulling up the gate terminal of the switch element 310. For example, even when the power semiconductor element 110 enters the ON state and the collector potential drops to approximately 0.6 V, the rectifying element 322 prevents current from flowing to the collector electrode of the power semiconductor element 110 and the capacitor 326 supplies the gate terminal of the switch element 310 with the accumulated charge, and therefore the potential of the gate terminal of the switch element 310 can be held.

The rectifying element 330 is connected between the resistor 324 and the reference potential. The rectifying element 330 is a Zener diode, for example. The rectifying element 330 prevents a voltage exceeding the rated voltage of the switch element 310 from being input to the gate terminal of the switch element 310 from the first terminal 104. For example, even when the collector potential of the power semiconductor element 110 rises to approximately 40 V, the rectifying element 330 clamps the voltage input to the ON potential supplying section 320 from the first terminal 104 side at a predetermined voltage value. For example, the rectifying element 330 clamps the voltage value to be within a range approximately from 6 V to 16 V.

The OFF potential supplying section 340 is connected between the reference potential and the gate of the switch element, and sets the gate potential of the switch element to be the OFF potential in response to a predetermined cutoff condition being satisfied. The OFF potential supplying section 340 connects the gate of the switch element 310 to the reference potential, in response to the predetermined cutoff condition being fulfilled, thereby supplying this gate with the reference potential that is the OFF potential.

The OFF potential supplying section 340 creates an electrical connection between the drain terminal and the source terminal, in response to the cutoff signal being the high potential, thereby supplying the reference potential to the gate terminal of the switch element 310. The OFF potential supplying section 340 is a normally-OFF switch element that creates an electrical disconnection between the drain terminal and the source terminal, in response to the cutoff signal being the low potential. In other words, the OFF potential supplying section 340 may be an n-channel MOSFET, in the same manner as the potential switching section 230 described in FIG. 2.

In the semiconductor apparatus 300 according to the present embodiment described above, the ON potential supplying section 320 supplies the gate terminal of the switch element 310 with the collector potential of the power semiconductor element 110 that is greater than the threshold value of the rectifying element 322 and less than or equal to the clamping voltage of the rectifying element 330. When the ignition apparatus 3000 is in an initial state or when the power semiconductor element 110 has entered the OFF state and enough time has passed for the voltage fluctuation caused by the ignition coil 30 to fall to approximately 0 V, the collector potential of the power semiconductor element 110 is the constant voltage Vb supplied by the power source 40. In this case, the clamping voltage of the rectifying element 330 is set to be greater than or equal to the constant voltage Vb.

Accordingly, the ON potential supplying section 320 supplies the gate terminal of the switch element 310 with the constant voltage Vb, and the capacitor 326 is charged with and holds the constant voltage supplied thereto. The ON potential supplying section 320 includes the rectifying element 322 having a threshold value Vf of approximately 0.6 V, and therefore the gate terminal of the switch element 310 is more accurately supplied with Vb-Vf.

When the collector potential of the power semiconductor element 110 temporarily drops, the ON potential supplying section 320 prevents a reversal of the current flowing toward the first terminal 104 from the rectifying element 322 and supplies the gate electrode of the switch element 310 with the charge accumulated by the capacitor 326, and therefore the gate potential of the switch element 310 can be kept constant. Even when the collector potential of the power semiconductor element 110 temporarily rises, the ON potential supplying section 320 releases the current resulting from the raised potential to the rectifying element 330 while limiting the current flowing therethrough with the resistor 324, and therefore the gate potential of the switch element 310 can be kept constant.

In this way, the ON potential supplying section 320 maintains a constant value of Vb-Vf, which is supplied to the gate terminal of the switch element 310, as the gate potential of the switch element 310. For example, since Vb is 14 V, the ON potential supplying section 320 supplies the gate terminal of the switch element 310 with the ON potential, and when the power semiconductor element 110 is operating normally, the switch element 310 enters the ON state. In this case, the source potential is the smaller potential from among Vb-Vf-Vth and the signal potential of the control signal input from the drain terminal.

When the ON potential of the control signal is 5 V, for example, the ON potential supplying section 320 maintains a potential (e.g. a constant potential greater than or equal to 6 V) that is higher than the ON potential of the control signal constant as the gate potential of the switch element 310. Accordingly, the semiconductor apparatus 300 can supply the gate terminal of the power semiconductor element 110 with a signal having a potential that is approximately the same as the signal potential of the control signal input from the control terminal.

When an abnormality is detected in the power semiconductor element 110, the semiconductor apparatus 300 according to the present embodiment supplies the gate terminal of the switch element 310 with the reference potential, in the same manner as the semiconductor apparatus 200 described in FIG. 2. In this way, the power semiconductor element 110 transitions to the OFF state and the discharge circuit 140 discharges the charge of the gate terminal of the power semiconductor element 110 to gently cut off the power semiconductor element 110.

In this way, in the semiconductor apparatus 300 according to the present embodiment, when the power semiconductor element 110 is in the normal state and the switching control signal is the high potential, the power semiconductor element 110 enters the ON state, in the same manner as in the semiconductor apparatus 100 and the semiconductor apparatus 200 described in FIGS. 1 and 2. Therefore, as described in FIG. 1, the ignition apparatus 3000 can ignite the combustion gas by causing the ignition plug 20 to discharge.

Furthermore, when abnormal conduction, abnormal heating, or the like occurs in the power semiconductor element 110, the cutoff signal source 130 cuts off the supply of the control signal from the control terminal 102 to the power semiconductor element 110. In this way, as described in FIG. 1, the semiconductor apparatus 300 can gently cut off the power semiconductor element 110 while preventing mistaken discharge of the ignition plug 20.

In other words, the semiconductor apparatus 300 according to the present embodiment can use the power semiconductor element 110, the switch element 310, and the OFF potential supplying section 340 that are MOS devices having the same polarity to reduce loss of the control signal and supply this control signal to the gate terminal of the power semiconductor element 110. Accordingly, the semiconductor apparatus 300 according to the present embodiment can safely switch between having conduction and having no conduction between the reference potential and the other end of the primary coil 32 of the ignition coil 30.

Figure 4:
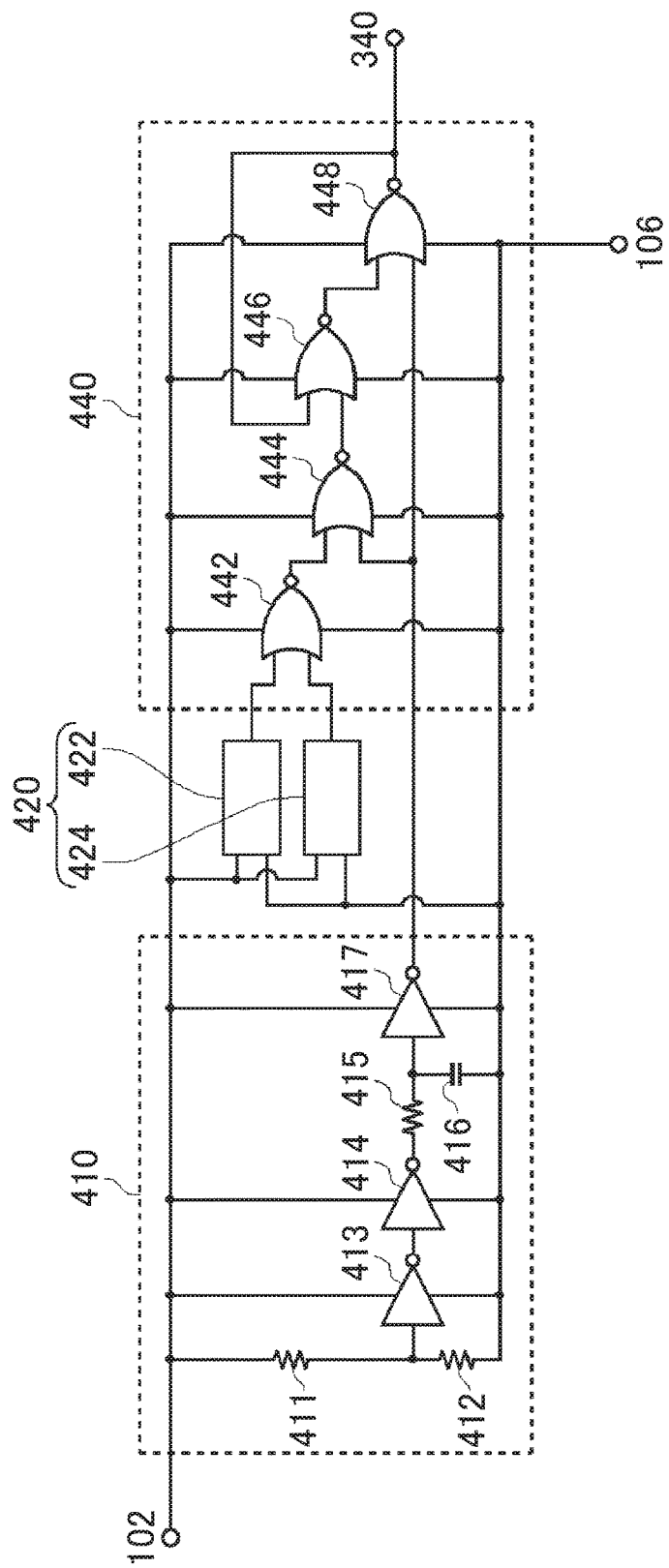
FIG. 4 shows an exemplary configuration of a cutoff signal source 130 according to an embodiment.

FIG. 4 shows an exemplary configuration of the cutoff signal source 130 according to the present embodiment. The cutoff signal source 130 includes a reset section 410, a cutoff condition detecting section 420, and a latch section 440.

The reset section 410 outputs a reset signal after a reference time has passed since the ON potential was input to the control terminal 102. The reset section 410 includes a resistor 411, a resistor 412, an inverter 413, an inverter 414, a resistor 415, a capacitor 416, and an inverter 417.

The resistor 411 and the resistor 412 are connected in series between the control terminal 102 and the second terminal 106, and voltage-divide the control signal Vin input from the control terminal 102. With R1 representing the resistance value of the resistor 411 and R2 representing the resistance value of the resistor 412, the voltage-divided potential is Vin·R2/(R1+R2). For example, when the control signal rises transiently and linearly from the OFF potential (0 V) to the ON potential (5 V), the voltage-divided potential also rises linearly from 0 V to 5·R2/(R1+R2).

The inverter 413 is connected between the resistor 411 and the resistor 412, receives the voltage-divided potential, inverts the voltage-divided potential, and outputs the result. The inverter 414 receives the output of the inverter 413, inverts the received output, and outputs the result. The resistor 415 and the capacitor 416 form an RC circuit, receive the output of the inverter 414, and output a rising signal that has a delay corresponding to a time constant RC. The inverter 417 receives the output of the resistor 415 and the capacitor 416, inverts the received output, and outputs the result.

The inverter 413, the inverter 414, and the inverter 417 each operate using the control signal input from the control terminal 102 as a power source. Accordingly, when the control signal rises transiently, each inverter outputs a signal having substantially the same potential as the control signal until the control signal reaches the threshold value of the inverter. In this example, each inverter has substantially the same threshold value of Vthi. The operations of each component in such a reset section 410 are described using FIG. 5.

Figure 5:
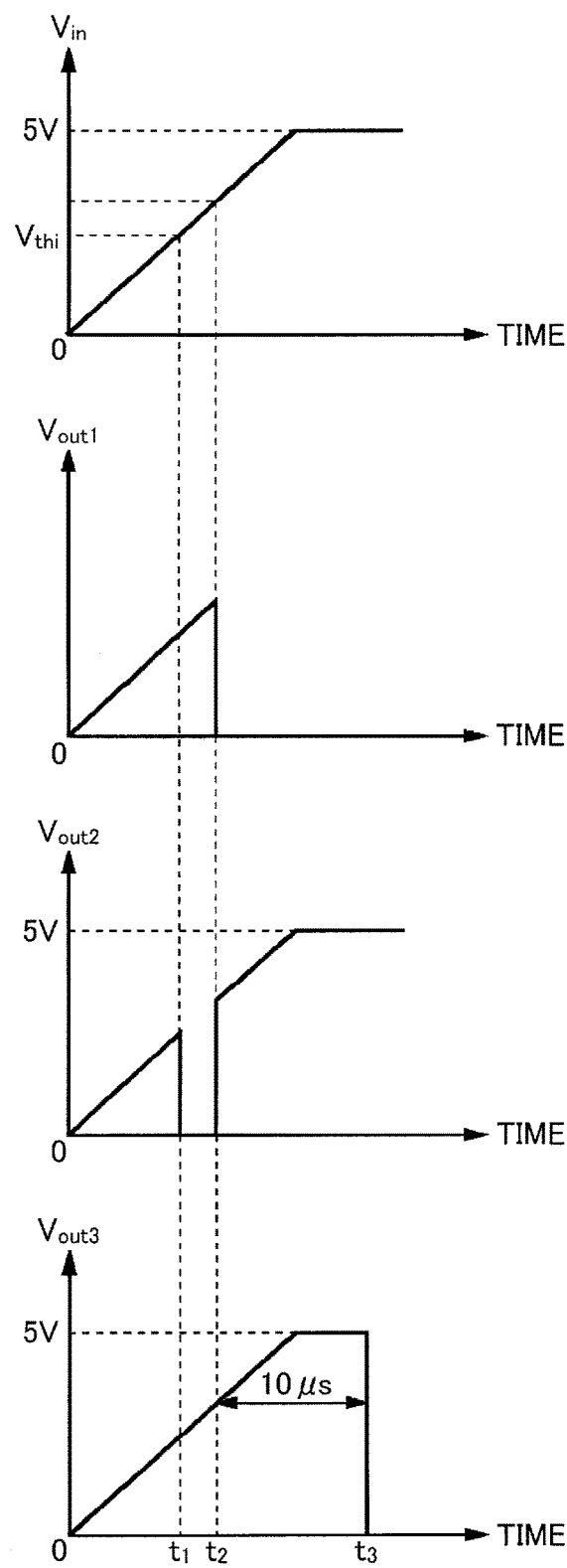
FIG. 5 shows an exemplary operational waveform of each component of the reset section 410 according to an embodiment.

FIG. 5 shows an exemplary operational waveform of each component of the reset section 410 according to the present embodiment. In FIG. 5, the horizontal axis indicates time and the vertical axis indicates the output potential. FIG. 5 shows an example of the output potentials of the inverter 413, the inverter 414, and the inverter 417 in a case where the control signal Vin input to the control terminal 102 rises linearly from the OFF potential (0 V) to the ON potential (5 V). The output potentials of the inverter 413, the inverter 414, and the inverter 417 are each substantially the same as the potential of the control signal Vin, until the input potential reaches the threshold value of the corresponding inverter.

Even when the potential of the power source of the inverter 413 exceeds the threshold value Vthi, the voltage-divided potential Vin·R2/(R1+R2) input to the inverter 413 is less than or equal to the threshold value Vthi, and therefore the inverter 413 inverts the input potential, which is the low potential, to be the high potential and outputs this high potential. Even when the inverter 413 operates to output the high potential, when the power source potential is a transient potential during the time needed to reach the high potential (e.g. 5 V), the inverter 413 outputs this power source potential as the high potential. FIG. 5 shows an example in which the output potential Vout1 of the inverter 413 is the power source potential Vin from the timing t1 and onward.

The inverter 413 performs the inversion and outputs the low potential in response to the power source potential exceeding the threshold value Vthi and the voltage-divided potential input to the inverter 413 exceeding the threshold value Vthi (i.e. input of the high potential). FIG. 5 shows an example in which the output potential Vout1 of the inverter 413 becomes the low potential (0 V) at the timing t2.

The inverter 414 performs the inversion and outputs the low potential in response to the power source potential exceeding the threshold value Vthi and the input potential exceeding the threshold value Vthi. FIG. 5 shows an example in which the output potential Vout2 of the inverter 414 becomes the low potential at the timing t1. The inverter 414 performs the inversion and outputs the high potential in response to the power source potential exceeding the threshold value Vthi and the input potential being the low potential. When there is a transient potential occurring during the time needed for the power source potential to reach the high potential, the inverter 414 outputs this power source potential as the high potential. FIG. 5 shows an example in which the output potential Vout2 of the inverter 414 is output as the power source potential Vin at the timing t2 and onward.

The RC circuit formed by the resistor 415 and the capacitor 416 delays the output signal of the inverter 414. FIG. 5 shows an example in which the RC circuit delays the output signal by 10 μs. The inverter 417 performs the inversion and outputs the low potential in response to the power source potential exceeding the threshold value Vthi and the input potential exceeding the threshold value Vthi. FIG. 5 shows an example in which the output potential Vout3 of the inverter 417 becomes the low potential at the timing t3.

As described above, the reset section 410 according to the present embodiment outputs the reset signal after a reference time t2 has passed since the ON potential was input to the control terminal 102. The reset signal shown in FIG. 5 is, for example, a pulse signal whose pulse width is a time constant set by the resistor 415 and the capacitor 416.

The cutoff condition detecting section 420 detects whether the predetermined cutoff condition has been satisfied. The cutoff condition detecting section 420 detects whether an abnormality such as a temperature increase has occurred in the power semiconductor element 110, peripheral circuits of the power semiconductor element 110, and/or the like. The cutoff condition detecting section 420 detects whether abnormal conduction in the power semiconductor element 110 has been occurring for at least a reference time, for example. Instead of or in addition to this, the cutoff condition detecting section 420 may detect whether the temperature of the power semiconductor element 110 is greater than or equal to the reference temperature by measuring the temperature of the power semiconductor element 110.

The cutoff condition detecting section 420 includes a plurality of detection circuits and the like, for example. FIG. 4 shows an example in which the cutoff condition detecting section 420 includes a timer circuit 422 and a temperature detecting circuit 424. The timer circuit 422 measures the time that has passed since the power semiconductor element 110 entered the ON state. The timer circuit 422 may determine that the cutoff condition has been satisfied and output the high potential in response to the measured time exceeding the reference time. The temperature detecting circuit 424 detects the temperature of the power semiconductor element 110 and/or the surrounding temperature of the power semiconductor element 110. The temperature detecting circuit 424 may determine that the cutoff condition has been fulfilled and output the high potential in response to the detected temperature exceeding a reference temperature.

The latch section 440 latches the affirmative detection of the cutoff condition. The latch section 440 includes a first NOR circuit 442, a second NOR circuit 444, a third NOR circuit 446, and a fourth NOR circuit 448. The first NOR circuit 442, the second NOR circuit 444, the third NOR circuit 446, and the fourth NOR circuit 448 each operate using the control signal input from the control terminal 102 as a power source. Accordingly, the latch section 440 outputs the cutoff signal corresponding to the detection of the cutoff condition, on a condition that the control signal is the high potential. The following describes the operation of the latch section 440 when the control signal is the high potential.

The first NOR circuit 442 receives the output of the timer circuit 422 and the output of the temperature detecting circuit 424, and outputs a NOR calculation result. The first NOR circuit 442 outputs the low potential when at least one of the timer circuit 422 and the temperature detecting circuit 424 is the high potential. In other words, the first NOR circuit 442 outputs the high potential when abnormalities are not detected in the power semiconductor element 110, and outputs the low potential in response to an abnormality being detected in the power semiconductor element 110.

The second NOR circuit 444 receives the output of the first NOR circuit 442 and the reset signal of the reset section 410, and outputs a NOR calculation result. In other words, the second NOR circuit 444 outputs the high potential when an abnormality is detected in the power semiconductor element 110 and the reset signal is not input.

The third NOR circuit 446 receives the output of the second NOR circuit 444 and the output of the latch section 440, and outputs a NOR calculation result. The fourth NOR circuit 448 receives the output of the third NOR circuit 446 and the reset signal, and outputs a NOR calculation result. The third NOR circuit 446 and the fourth NOR circuit 448 form an RS flip-flop. In other words, after the reset signal is input to the fourth NOR circuit 448, the third NOR circuit 446 and the fourth NOR circuit 448 latch the high potential corresponding to the detection of the abnormality in the power semiconductor element 110 input to the third NOR circuit 446 as a set signal. The latch section 440 receive the power source supply from the control terminal and holds the latched value.

In the manner described above, in the cutoff signal source 130 according to the present embodiment, the latch section 440 latches the cutoff condition as being satisfied in response to the detection of an abnormality in the power semiconductor element 110, on a condition that the control signal is the high potential. The cutoff signal source 130 supplies the OFF potential supplying section 340 with the cutoff signal. The OFF potential supplying section 340 sets the gate potential of the switch element 310 to be the OFF potential, in response to the latch section 440 latching the cutoff condition as being satisfied. In this way, the gate terminal of the power semiconductor element 110 becomes the OFF potential, and therefore at least the OFF potential supplying section 340 functions as a cutoff section for setting the gate potential of the power semiconductor element 110 to be the OFF potential in response to the latch section 440 latching the cutoff condition as being satisfied.

Figure 6:
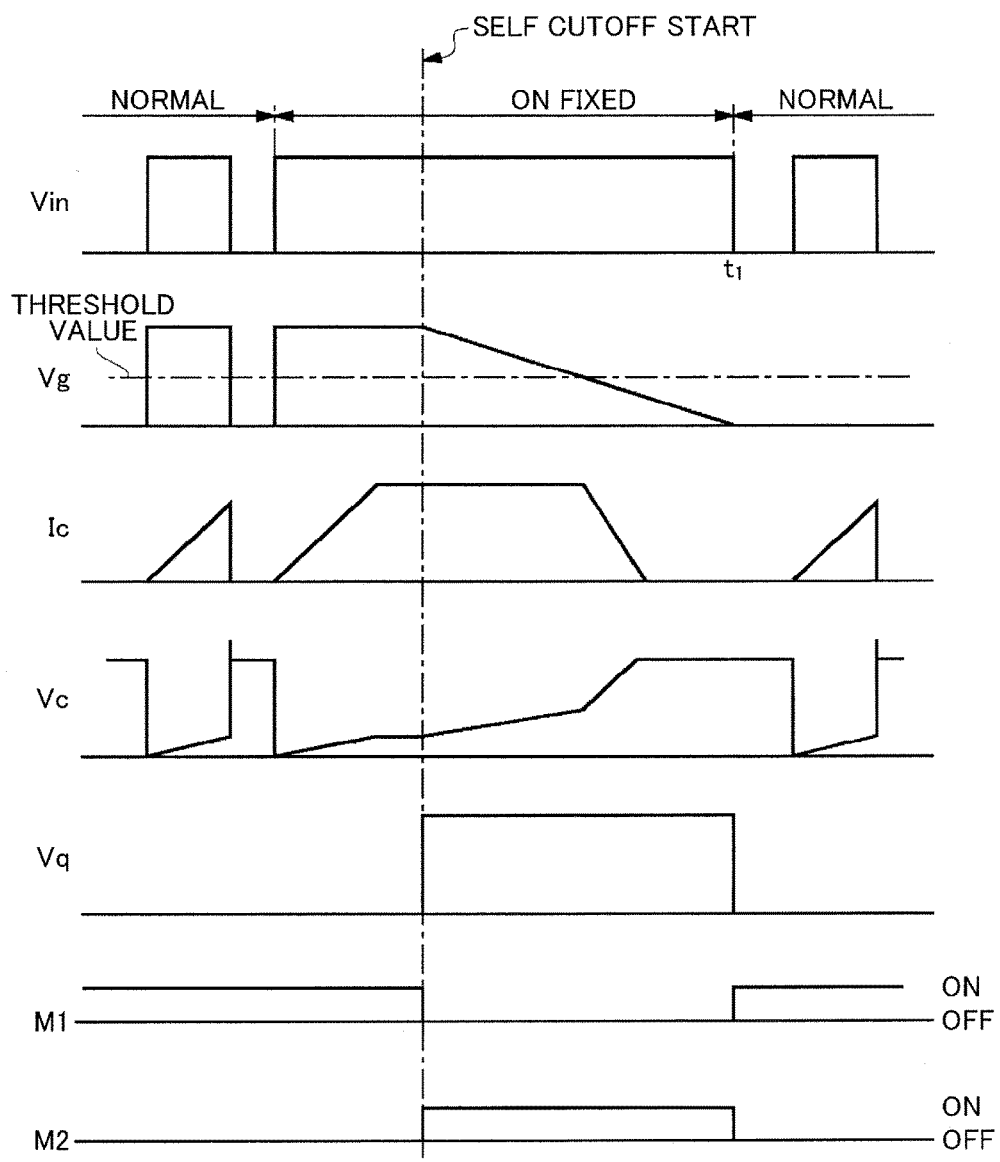
FIG. 6 shows a first example of an operational waveform of each component of the semiconductor apparatus 300 according to an embodiment.

In the manner described above, the semiconductor apparatus 300 according to the present embodiment operates as an ignitor that controls the current flowing to the ignition coil 30 according to a control signal from the outside. The operation of the semiconductor apparatus 300 is described using FIG. 6. FIG. 6 shows a first example of an operational waveform of each component of the semiconductor apparatus 300.

In FIG. 6, the horizontal axis indicates time and the vertical axis indicates the potential or the current value. In FIG. 6, Vin represents the control signal input from the control terminal 102, Vg represents the gate potential of the power semiconductor element 110, Ic represents the collector-emitter current (referred to as the collector current) of the power semiconductor element 110, Vc represents the collector-emitter potential (referred to as the collector potential) of the power semiconductor element 110, Vq represents the output potential (cutoff signal) of the cutoff signal source 130, M1 represents the ON/OFF state of the switch element 310, and M2 represents the ON/OFF state of the OFF potential supplying section 340.

In a normal state where no abnormalities have been detected in the semiconductor apparatus 300, the cutoff signal Vq is the low potential (e.g. 0 V), the OFF potential supplying section 340 (M2) is in the OFF state, and the switch element 310 (M1) is in the ON state. Therefore, when the control signal Vin input to the control terminal 102 is the low potential, this low potential becomes the gate potential Vg of the power semiconductor element 110, the collector current Ic becomes substantially 0 A, and the collector potential Vc becomes the output potential of the power source. When the control signal Vin is the high potential, this high potential becomes the gate potential Vg of the power semiconductor element 110, thereby switching the power semiconductor element 110 to the ON state, such that the collector current begins to increase and the collector potential Vc begins increasing after reaching substantially 0 V.

When the control signal Vin again becomes the low potential, this low potential becomes the gate potential Vg of the power semiconductor element 110, thereby switching the power semiconductor element 110 to the OFF state. In this way, the ignition operation described in FIG. 1 is performed, and the collector current Ic returns to substantially 0 A and the collector potential Vc returns to the output potential of the power source. The ignition operation includes the collector potential Vc returning to the output potential of the power source after temporarily reaching the high potential. The above describes the operation of the semiconductor apparatus 300 in the range shown in FIG. 6 where the control signal Vin is "normal".

The following describes an example in which an abnormality occurs in the control signal generating section 10 and the control signal Vin remains at the high potential and is unable to switch to the low potential. In this case, as described above, in a state where the control signal Vin has become the high potential. the gate potential Vg is the high potential, the collector current Ic begins to increase, and the collector potential Vc begins to increase after reaching substantially 0 V.

Here, the control signal Vin remains at the high potential, and therefore the gate potential Vg remains at the high potential and the collector current Ic becomes saturated by increasing to a current value (e.g. 17 A) determined according to the element constant and the like, and this causes the collector potential Vc to also be saturated. Here, since a saturated current flows through the power semiconductor element 110, the temperature of the power semiconductor element 110 and/or the surrounding temperature of the power semiconductor element 110 increases, the cutoff condition detecting section 420 detects this abnormal state, and the semiconductor apparatus 300 begins the self cutoff. FIG. 6 shows the start timing of the self cutoff with a single-point dashed line, for example.

As a result, the cutoff signal Vq becomes the high potential and the OFF potential supplying section 340 enters the ON state, thereby switching the switch element 310 to the OFF state. In this way, the power semiconductor element 110 begins switching to the OFF state, but due to the discharge circuit 140, the gate potential Vg of the power semiconductor element 110 transitions gradually to the low potential, instead of switching to the low potential as would occur during normal operation. As a result, the collector current Ic begins decreasing from when the gate potential Vg becomes less than or equal to the threshold value, and ultimately returns to 0 A. The collector potential Vc rises gradually to a value at which the ignition operation does not begin, and then, in response to the gate potential Vg becoming less than or equal to the threshold value, the rate at which the collector potential Vc rises increases, and the collector potential Vc ultimately returns to the potential of the initial state.

After the collector current Ic and the collector potential Vc have returned to their original states, the gate potential Vg returns to the low potential. When the control signal generating section 10 returns to the original state and the control signal becomes the low potential, the power source supply of the cutoff signal source 130 is cut off, and therefore the cutoff signal Vq becomes the low potential and the OFF potential supplying section 340 enters the OFF state, thereby switching the switch element 310 to the ON state. The above describes the operation of the semiconductor apparatus 300 in the range shown in FIG. 6 where the control signal Vin is "fixed ON." With the semiconductor apparatus 300 according to the present embodiment, even when there is an abnormality occurring in the power semiconductor element 110 based on an operational abnormality or the like in an apparatus or the like outside the semiconductor apparatus 300, such as the control signal generating section 10 in this example, it is possible to detect the abnormality in the power semiconductor element 110 and gently cut off the semiconductor apparatus 300.

Figure 7:
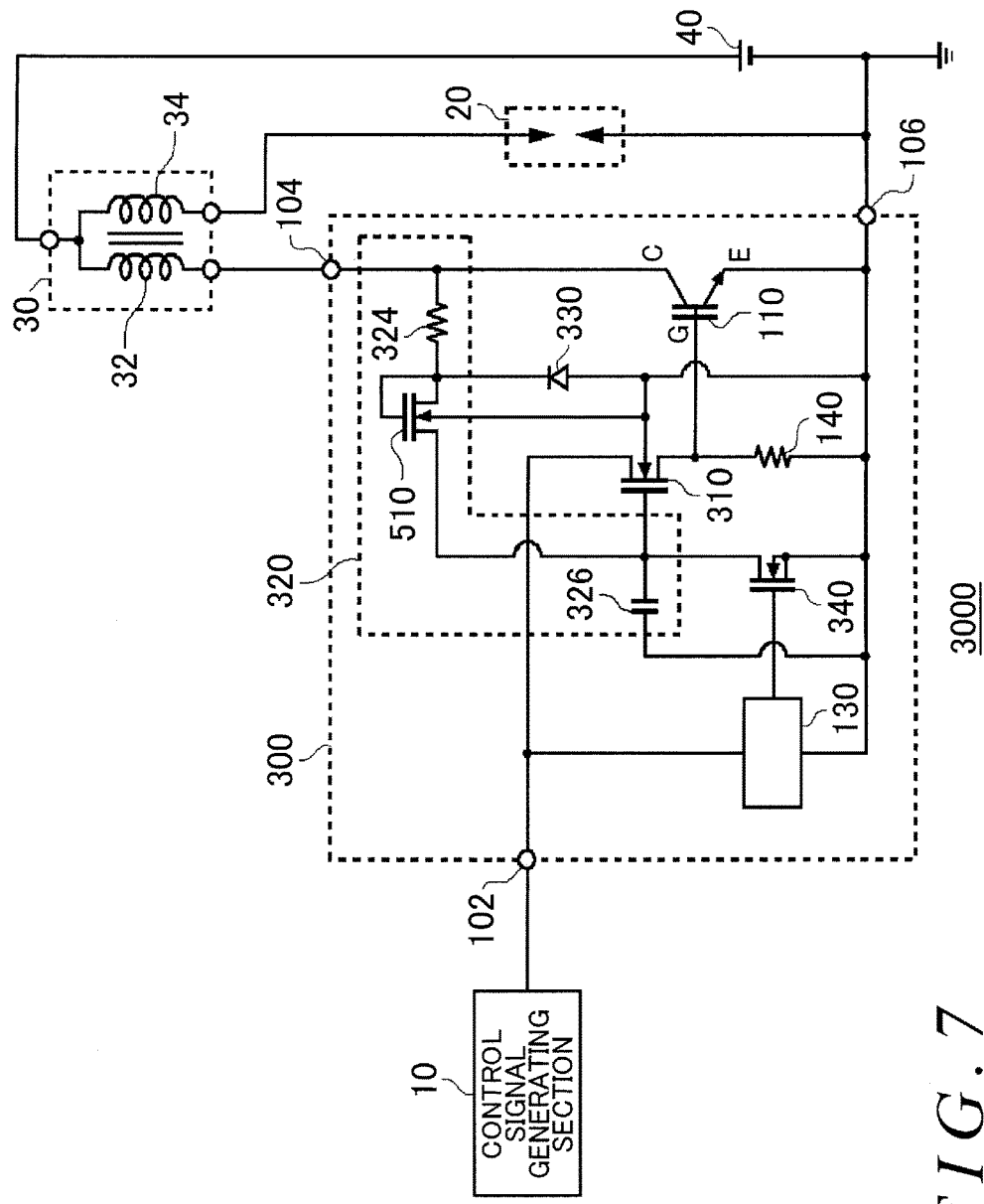
FIG. 7 shows an exemplary configuration of the ignition apparatus 3000 including a first modification of the semiconductor apparatus 300 according to an embodiment.

FIG. 7 shows an exemplary configuration of the ignition apparatus 3000 including a first modification of the semiconductor apparatus 300 according to the present embodiment. In the ignition apparatus 3000 shown in FIG. 7, components that have substantially the same operation as components of the ignition apparatus 3000 according to the embodiment shown in FIG. 3 are given the same reference numerals and descriptions thereof are omitted. The semiconductor apparatus 300 according to the first modification includes a switch element 510 in the ON potential supplying section 320.

The switch element 510 is connected between the resistor 324 and the gate terminal of the switch element 310, and is connected as a rectifying circuit that causes current to flow in one direction from the first terminal toward the gate terminal of the switch element 310. The drain terminal and the gate terminal of the switch element 510 are connected to the resistor 324, and the source terminal of the switch element 510 is connected to the gate terminal of the switch element 310. Accordingly, the switch element 510 can perform substantially the same operation as the rectifying element 322 described in FIG. 3, and the semiconductor apparatus 300 according to the first modification can perform substantially the same operation as the semiconductor apparatus 300 described in FIGS. 3 to 6. In this way, the semiconductor apparatus 300 according to the first modification need not include the rectifying element 322.

Figure 8:
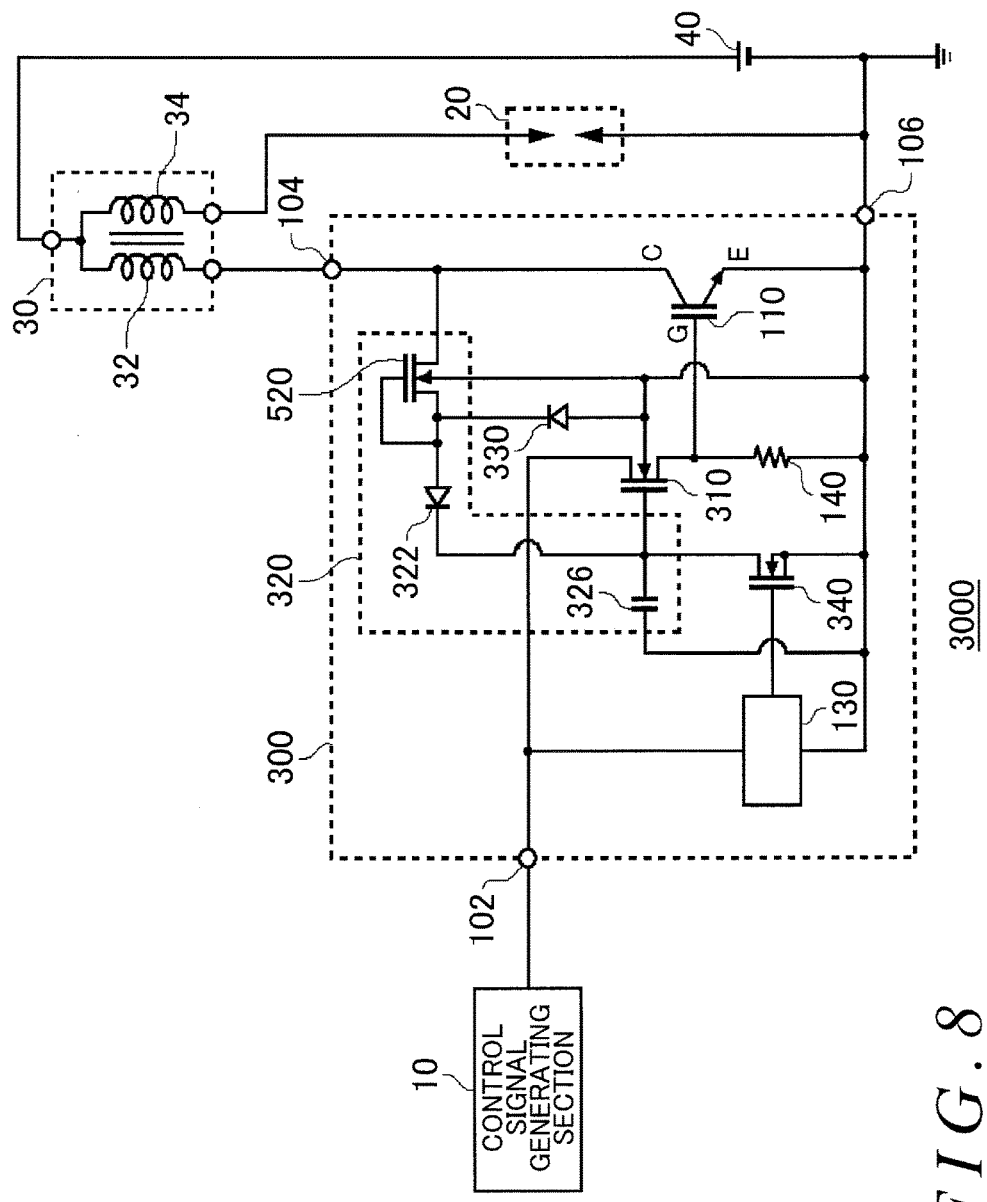
FIG. 8 shows an exemplary configuration of the ignition apparatus 3000 including a second modification of the semiconductor apparatus 300 according to an embodiment.

FIG. 8 shows an exemplary configuration of the ignition apparatus 3000 including a second modification of the semiconductor apparatus 300 according to the present embodiment. In the ignition apparatus 3000 shown in FIG. 8, components that have substantially the same operation as components of the ignition apparatus 3000 according to the embodiment shown in FIG. 3 are given the same reference numerals and descriptions thereof are omitted. The semiconductor apparatus 300 according to the second modification includes a switch element 520 in the ON potential supplying section 320.

The switch element 520 is connected between the first terminal 104 and the rectifying element 322, and is connected as a circuit for limiting the current flowing through the gate terminal of the switch element 310 from the first terminal. The drain terminal of the switch element 520 is connected to the first terminal 104, the source terminal of the switch element 520 is connected to the rectifying element 322, and the gate terminal of the switch element 520 is connected to the source terminal. In this case, the switch element 520 may be a depression (normally-ON) MOSFET.

A current proportional to the drain-source potential (i.e. the drain-gate potential) flows through the switch element 520, and therefore the switch element 520 functions as a resistor. Accordingly, the semiconductor apparatus 300 according to the second modification may include the switch element 520 the instead of the resistor 324. Furthermore, when the drain potential rises to approximately 40 V, the current flowing between the drain and the source of the switch element 520 due to saturation becomes approximately 100 μA, for example. Therefore, it is possible to prevent an excessive current from flowing through the rectifying element 330. In the manner described above, the switch element 520 functions as the resistor 324, and therefore the semiconductor apparatus 300 according to the second modification can perform substantially the same operation as the semiconductor apparatus 300 described in FIGS. 3 to 6.

Figure 9:
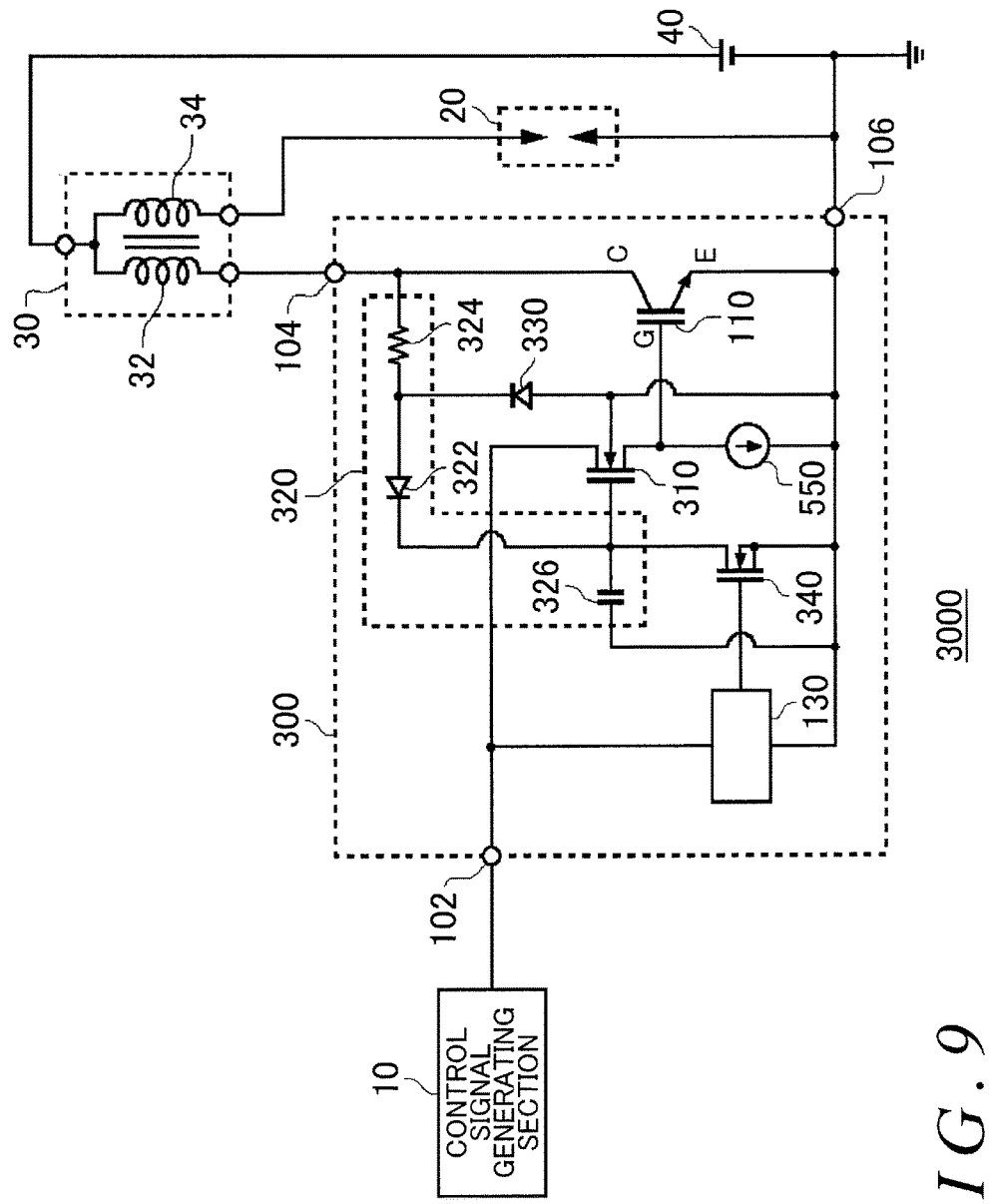
FIG. 9 shows an exemplary configuration of the ignition apparatus 3000 including a third modification of the semiconductor apparatus 300 according to an embodiment.

FIG. 9 shows an exemplary configuration of the ignition apparatus 3000 including a third modification of the semiconductor apparatus 300 according to the present embodiment. In the ignition apparatus 3000 shown in FIG. 9, components that have substantially the same operation as components of the ignition apparatus 3000 according to the embodiment shown in FIG. 3 are given the same reference numerals and descriptions thereof are omitted. The semiconductor apparatus 300 according to the third modification includes a constant current circuit 550.

The constant current circuit 550 is connected between the gate of the power semiconductor element 110 and the reference potential, and discharges the charge accumulated in the capacitance component of the gate of the power semiconductor element 110. In other words, the constant current circuit 550 performs the same operation as the discharge circuit 140, and therefore may be provided as a discharge circuit. In this case, the constant current circuit 550 may be provided instead of the discharge circuit 140. Alternatively, the constant current circuit 550 may be provided in parallel with the discharge circuit 140. In this way, since the constant current circuit 550 operates in the same manner as the discharge circuit 140, the semiconductor apparatus 300 according to the third modification can perform substantially the same operation as the semiconductor apparatus 300 described in FIGS. 3 to 6.

Figure 10:
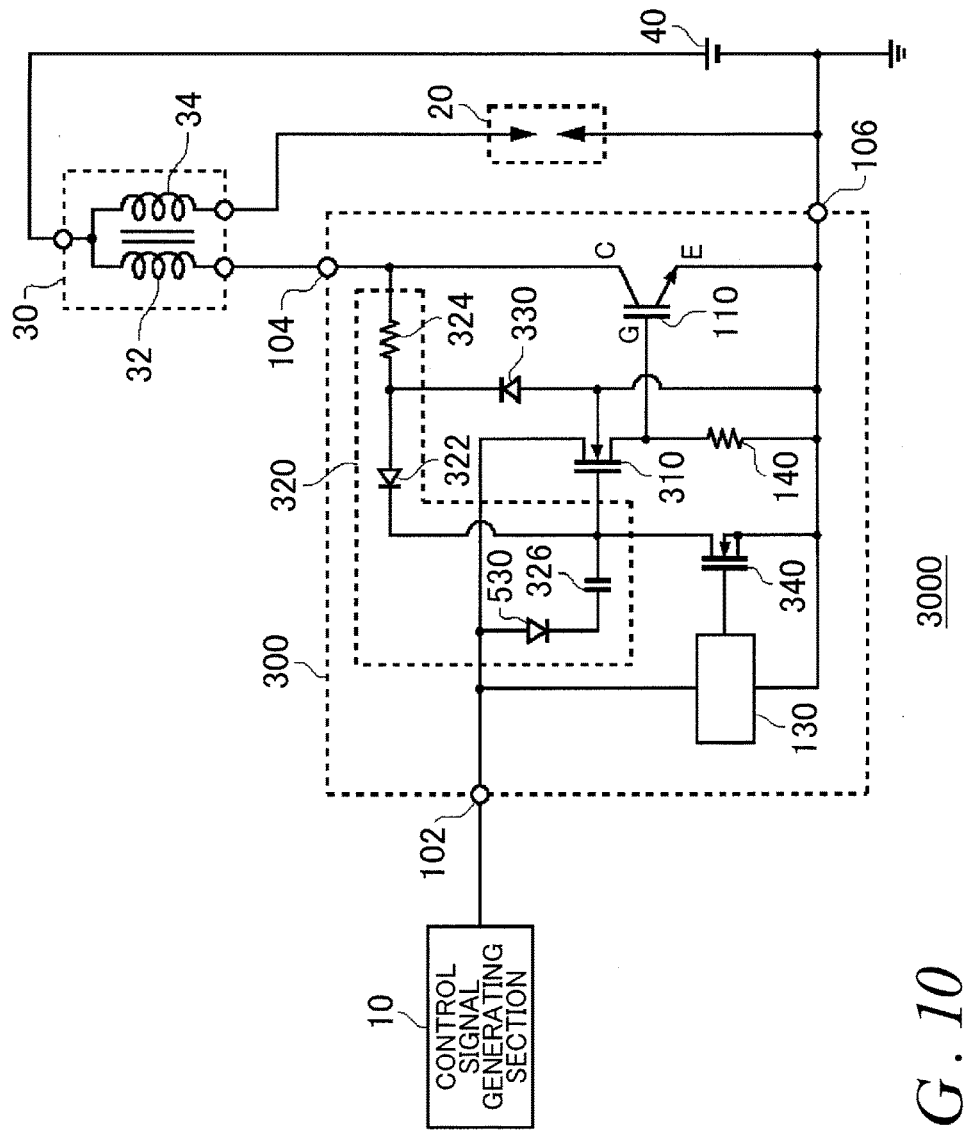
FIG. 10 shows an exemplary configuration of the ignition apparatus 3000 including a fourth modification of the semiconductor apparatus 300 according to an embodiment.

FIG. 10 shows an exemplary configuration of the ignition apparatus 3000 including a fourth modification of the semiconductor apparatus 300 according to the present embodiment. In the ignition apparatus 3000 shown in FIG. 10, components that have substantially the same operation as components of the ignition apparatus 3000 according to the embodiment shown in FIG. 3 are given the same reference numerals and descriptions thereof are omitted. The semiconductor apparatus 300 according to the fourth modification includes a rectifying element 530.

The rectifying element 530 is connected between the control terminal 102 and a terminal of the capacitor 326 on the opposite side of the switch element 310, and causes current to flow from the control terminal 102 to the capacitor 326. The rectifying element 530 is a diode, for example. The terminal of the capacitor 326 on the opposite side of the switch element 310 in the fourth modification is electrically separated from the reference potential. In other words, the capacitor 326 is provided between the gate of the switch element and the control terminal 102. Therefore, when the control signal with the ON potential is input from the control terminal 102, the terminal of the capacitor 326 on the opposite side of the switch element 310 becomes this ON potential (or more accurately, a potential obtained by subtracting the threshold value of the rectifying element 530 from the ON potential). Accordingly, the terminal of the capacitor 326 on the switch element 310 side has an offset corresponding to this ON potential added thereto, thereby enabling an increase in the gate potential of the switch element 310.

In other words, the semiconductor apparatus 300 according to the fourth modification can expand the range in which the power source 40 provided in the ignition apparatus 3000 is capable of operating. Therefore, the output potential of the power source 40 may be set to a low potential of approximately 4 V, for example, and the semiconductor apparatus 300 can improve the degree of design freedom for the ignition apparatus 3000. The semiconductor apparatus 300 according to the fourth embodiment described above increases the gate potential of the switch element 310, and therefore can perform substantially the same operation as the semiconductor apparatus 300 described in FIGS. 3 to 6.

The semiconductor apparatus 300 according to the present embodiment described above is an example in which the semiconductor apparatus 300 can perform a self cutoff operation when an abnormality is detected in the power semiconductor element 110. Here, the latch section 440 provided in the semiconductor apparatus 300 uses the control signal as a power source, and therefore the semiconductor apparatus 300 can be formed as a module in which power source terminals are unnecessary. On the other hand, during the period when the latch section 440 is to be operating, it is preferable that the control signal generating section 10 reliably outputs the control signal.

For example, when an abnormality occurs in the control signal generating section 10 and the control signal becomes the low potential while the semiconductor apparatus 300 is performing the self cutoff operation, there are cases where the semiconductor apparatus 300 cannot be gently cut off. An example of such a case is described using FIG. 11.

Figure 11:
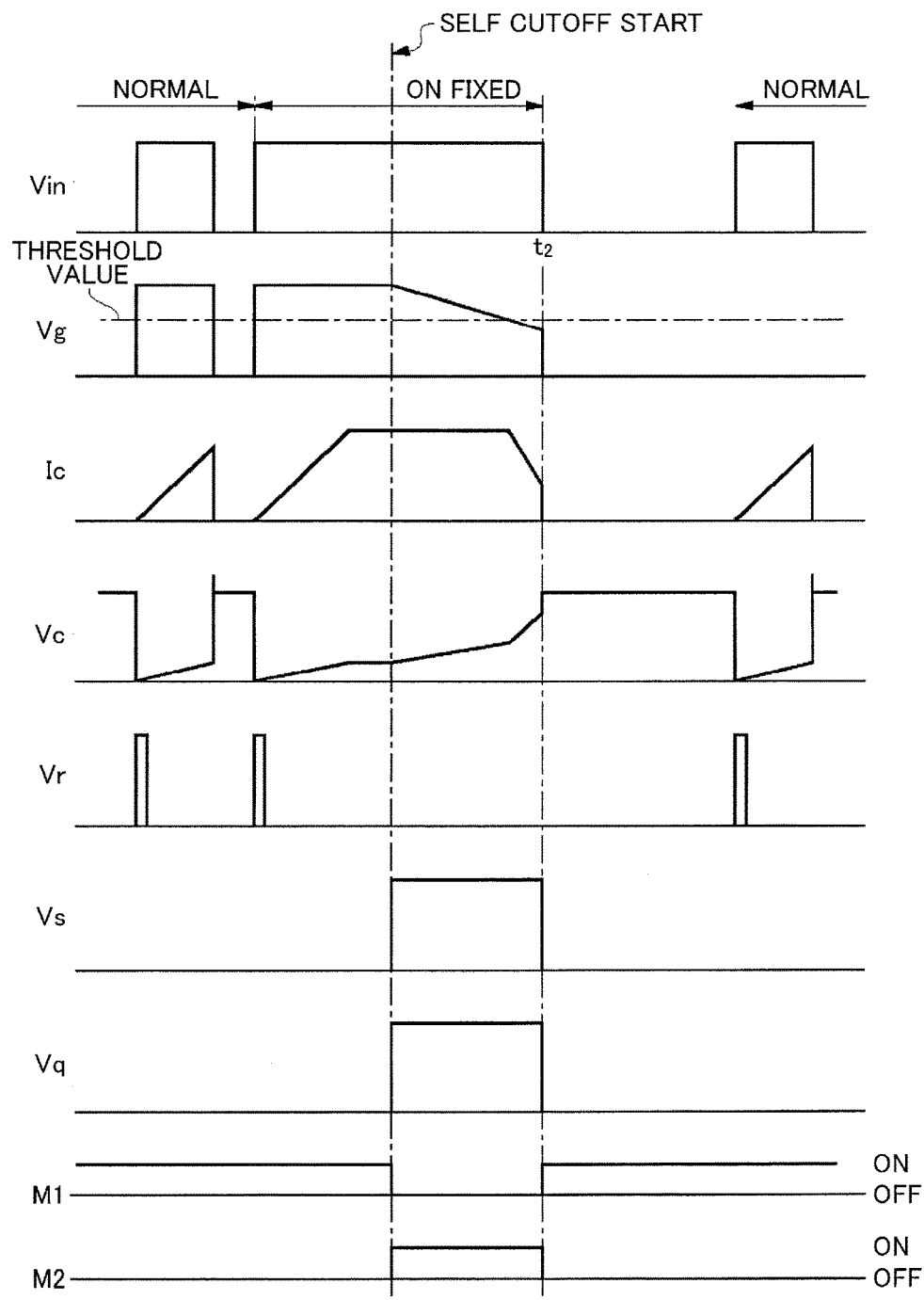
FIG. 11 shows a second example of an operational waveform of each component of the semiconductor apparatus 300 according to an embodiment.

FIG. 11 shows a second example of the operational waveform of each component of the semiconductor apparatus 300 according to the present embodiment. In the second example of the operational waveform of each component of the semiconductor apparatus 300 shown in FIG. 11, components that have substantially the same operation as components of the first example of the operational waveforms of each component of the semiconductor apparatus 300 shown in FIG. 6 are given the same reference numerals or symbols and descriptions thereof are omitted. In FIG. 11, Vs represents the set signal input to the latch section 440 and Vr represents the reset signal. In the same manner as FIG. 6, FIG. 11 shows an example in which an abnormality occurs in the control signal generating section 10, the control signal Vin remains at the high potential and is unable to switch to the low potential, and the self cutoff of the semiconductor apparatus 300 is begun.

In other words, the cutoff signal Vq becomes the high potential and the OFF potential supplying section 340 enters the ON state, thereby switching the switch element 310 to the OFF state. As a result, the power semiconductor element 110 begins to switch to the OFF state, and due to the discharge circuit 140, the gate potential Vg of the power semiconductor element 110 gradually transitions to the low potential. In this way, during the process of the gate potential Vg changing to the low potential, there are cases where the control signal generating section 10 stops supplying the control signal with the high potential. In this case, the latch section 440 stops supplying the operating power source, and therefore the cutoff signal Vq becomes the low potential.

Since the cutoff signal Vq becomes the low potential, the OFF potential supplying section 340 enters the OFF state and the switch element 310 is switched to the ON state. When the switch element 310 enters the ON state, the control signal that has become the low potential is supplied to the gate terminal of the power semiconductor element 110, and therefore the power semiconductor element 110 is switched to the OFF state. Here, there are cases where the charge accumulated in the gate terminal of the power semiconductor element 110 flows to the control signal generating section 10 outputting the low potential, and in such a case, the power semiconductor element 110 is suddenly switched to the OFF state.

FIG. 11 shows an example in which, at the timing t2, the gate potential Vg suddenly becomes the low potential and the collector current Ic suddenly becomes 0 A. Due to this sudden change in the collector current Ic, there are cases where the ignition apparatus 3000 causes the ignition plug 20 to mistakenly perform ignition. In order to prevent such mistaken ignition, a terminal for supplying a power source may be provided in the latch section 440 and the power source may be supplied from the outside, but in such a case, an external power source becomes necessary. Therefore, the semiconductor apparatus 300 according to the present embodiment prevents mistaken ignition by the ignition plug 20 without using an external power source. Such a semiconductor apparatus 300 is described using FIG. 12.

Figure 12:
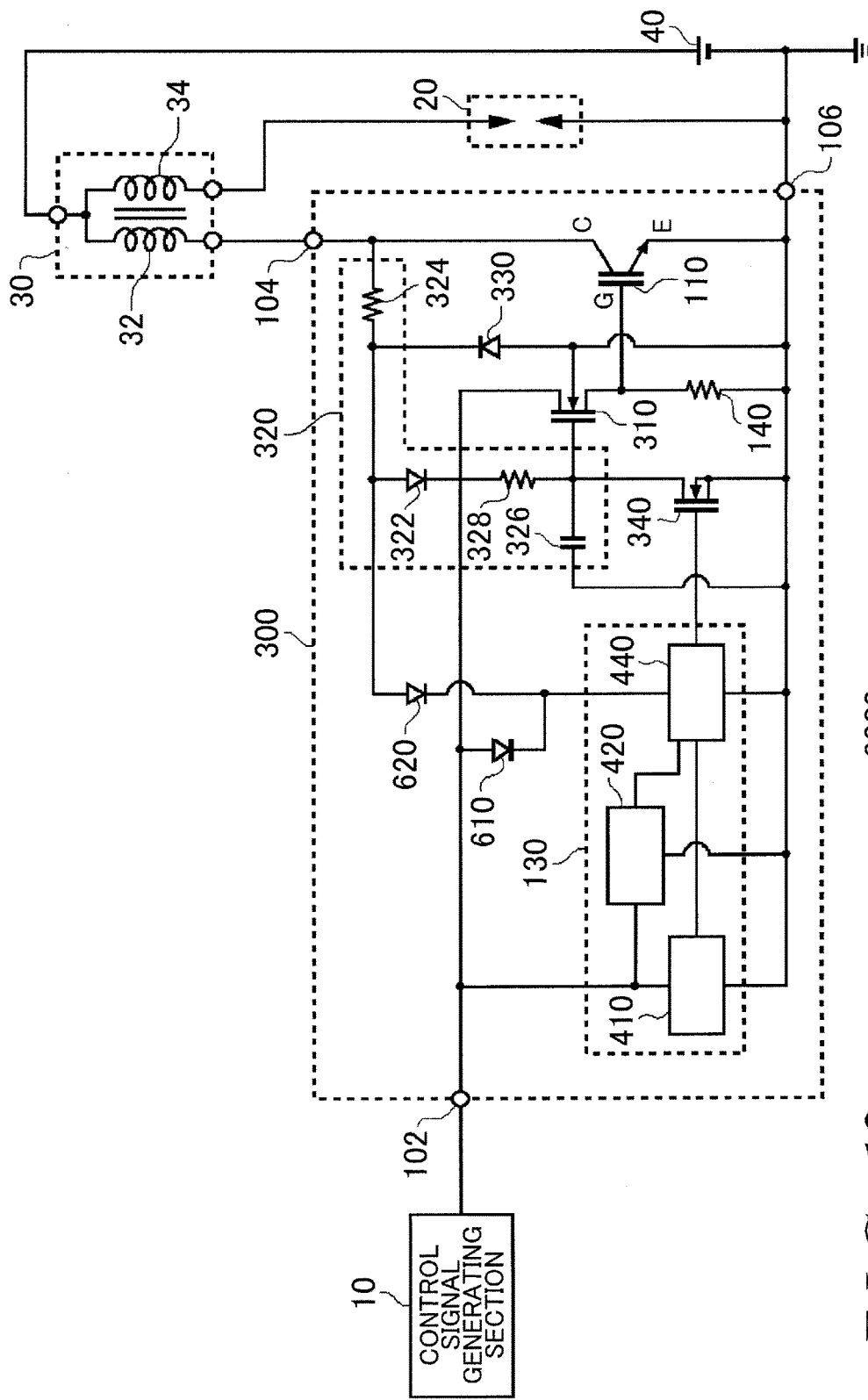
FIG. 12 shows an exemplary configuration of the ignition apparatus 3000 including a fifth modification of the semiconductor apparatus 300 according to an embodiment.

FIG. 12 shows an exemplary configuration of the ignition apparatus 3000 including a fifth modification of the semiconductor apparatus 300 according to the present embodiment. In the ignition apparatus 3000 shown in FIG. 12, components that have substantially the same operation as components of the ignition apparatus 3000 according to the embodiment shown in FIG. 3 are given the same reference numerals and descriptions thereof are omitted. The semiconductor apparatus 300 according to the fifth modification shown in FIG. 12 is an example in which the reset section 410, the cutoff condition detecting section 420, and the latch section 440 are included as the cutoff signal source 130. The semiconductor apparatus 300 according to the fifth modification includes a first rectifying element 610 and a second rectifying element 620.

The first rectifying element 610 is connected between the control terminal 102 and the latch section 440 of the cutoff signal source 130, and supplies the latch section 440 with the control signal input from the control terminal 102. In other words, the latch section 440 receives the power source supply via the first rectifying element 610 from the control terminal 102 that inputs the control signal for controlling the power semiconductor element 110. For example, when the high potential of the control signal is approximately 5 V, the first rectifying element 610 supplies the latch section 440 with a potential of approximately 4.4 V on a condition that this control signal is the high potential. Here, the threshold value of the first rectifying element 610 is approximately 0.6 V. The first rectifying element 610 is a diode, for example.

The second rectifying element 620 is connected between the resistor 324 of the ON potential supplying section 320 and the latch section 440, and supplies the latch section 440 with the potential of the first terminal 104 via the resistor 324. In other words, the latch section 440 receives the power source supply via the second rectifying element 620 from the first terminal 104. For example, when the breakdown voltage of the rectifying element 330 is approximately 6 V, the second rectifying element 620 supplies the latch section 440 with a potential of approximately 5.4 V on a condition that the collector potential Vc is greater than or equal to 6 V. Here, the threshold value of the second rectifying element 620 is approximately 0.6 V. The second rectifying element 620 is a diode, for example.

The semiconductor apparatus 300 according to the fifth modification shown in FIG. 12 is an example including the resistor 328 in the ON potential supplying section 320. The resistor 328 operates as a protective resistance that limits the amount of current flowing when the OFF potential supplying section 340 is in the ON state.

In the manner described above, the latch section 440 according to the present embodiment receives the power source supply from the control terminal 102 and the first terminal 104, and holds a latched value. Accordingly, the latch section 440 can receive the power source supply on a condition that the control signal is the high potential or the collector potential Vc is greater than or equal to the operating potential, and therefore the latched value can be held even when the control signal becomes the low potential. The following describes the operation of such a semiconductor apparatus 300.

Figure 13:
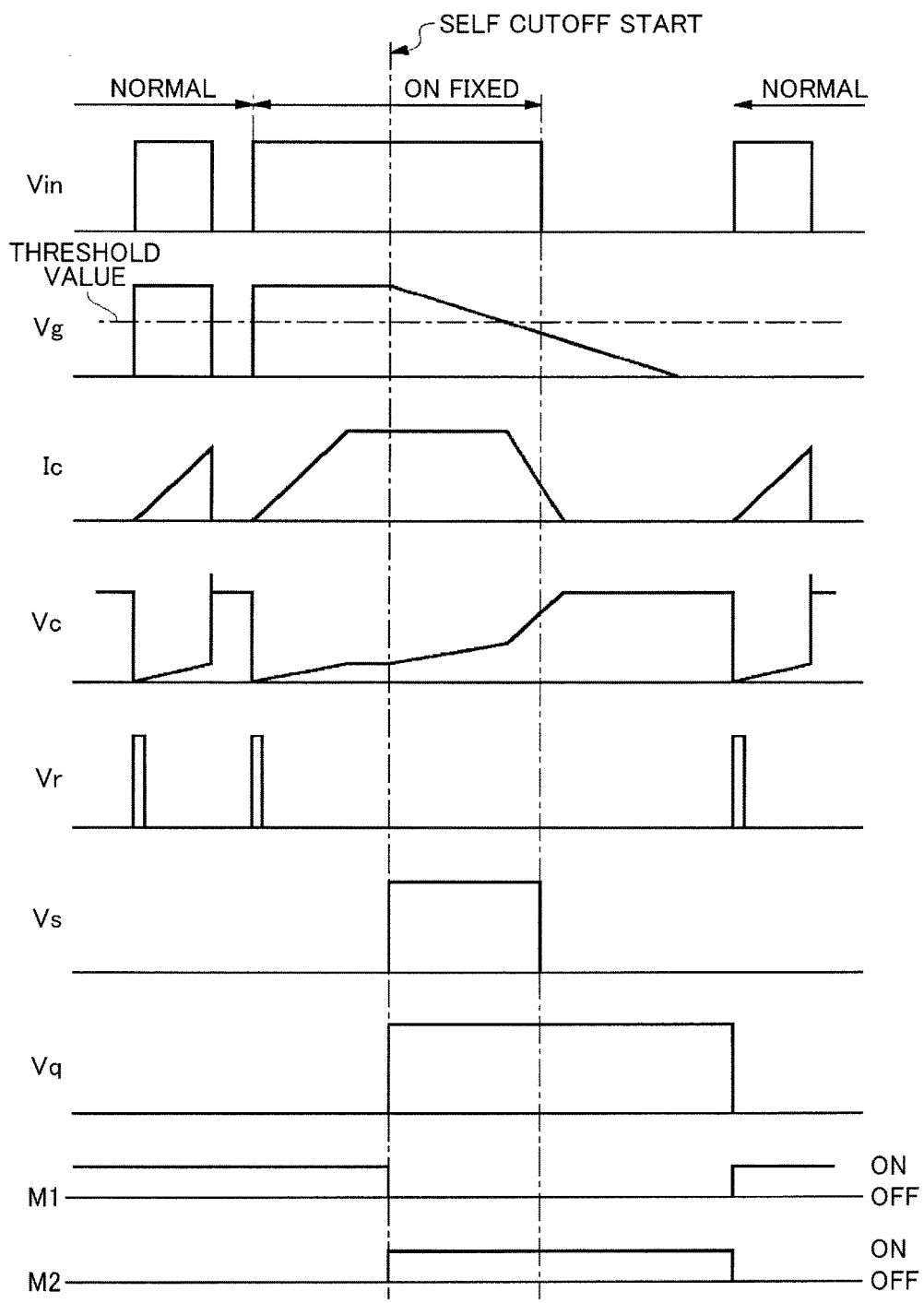
FIG. 13 shows an example of an operational waveform of each component of the semiconductor apparatus 300 of a fifth modification according to an embodiment.

FIG. 13 shows the operational waveforms of each component of the semiconductor apparatus 300 according to the fifth modification the present embodiment. In the operational waveforms of each component of the semiconductor apparatus 300 according to the fifth modification shown in FIG. 13, components that have substantially the same operation as components of the first example and the second example of the operational waveforms of each component of the semiconductor apparatus 300 according any one of the embodiments shown in FIG. 6 and FIG. 11 are given the same reference numerals or symbols and descriptions thereof are omitted. In the same manner as in FIGS. 6 and 11, FIG. 13 shows an example in which an abnormality occurs in the control signal generating section 10, the control signal Vin remains at the high potential and is unable to switch to the low potential, and the self cutoff of the semiconductor apparatus 300 is begun.

In other words, the cutoff signal Vq becomes the high potential and the OFF potential supplying section 340 enters the ON state, thereby switching the switch element 310 to the OFF state. As a result, the power semiconductor element 110 begins switching to the OFF state, but due to the discharge circuit 140, the gate potential Vg of the power semiconductor element 110 gradually transitions to the low potential. In the same manner as the example of FIG. 11, FIG. 13 shows an example in which, during the process of the gate potential Vg changing to the low potential, the control signal generating section 10 stops the supply of the high potential of the control signal.

In this case, the latch section 440 stops the supply of the operating power source from the control terminal 102. However, there are cases where the collector potential Vc of the power semiconductor element 110 rises to be greater than or equal to the operating potential of the latch section 440. In such a case, the latch section 440 can receive the power source supply from the first terminal 104 side. In other words, the latch section 440 can receive the power source supply from the first terminal 104 side, hold the latched value, and continue supplying the cutoff signal to the OFF potential supplying section 340.

Therefore, the OFF potential supplying section 340 continues to be in the ON state and the switch element 310 continues to be in the OFF state. In other words, the gate potential Vg of the power semiconductor element 110 continues the gradual transition to the low potential and eventually returns to the low potential, the collector current Ic returns to 0 A, and the collector potential Vc returns to the potential of the initial state. The latch section 440 continues being supplied with the power source from the first terminal 104 and holds the latched value.

When the control signal generating section 10 returns to the original state and the next control signal with the high potential is input from the control terminal 102, the reset section 410 outputs the pulsed reset signal Vr and the latch section 440 is reset to stop the supply of the cutoff signal. In this way, the OFF potential supplying section 340 enters the OFF state and the switch element 310 enters the ON state, thereby enabling a new ignition operation to begin.

The semiconductor apparatus 300 according to the present embodiment described above includes an example in which the latch section 440 receives the power source supply from the control terminal 102 and an example in which the latch section 440 receives the power source supply from the control terminal 102 and the first terminal 104. In addition to this, the latch section 440 may receive the power source supply from the first terminal 104 and hold the latched value. Since the ignition coil 30 and the like are connected to the first terminal 104, fluctuation occurs in the potential during the ignition operation, but on the other hand, it is possible to prevent excessive current and excessive potential from being mixed in by using the resistor 324, the rectifying element 330, and the like. Accordingly, the semiconductor apparatus 300 can safely and stably perform the ignition operation without adding new power source input terminals or circuits for preventing excessive current and excessive potential from being mixed in.

The above describes an example of the semiconductor apparatus 300 according to the present embodiment in which the capacitor 326 supplies the gate electrode of the switch element 310 with the accumulated charge, and keeps the gate potential of the switch element 310 constant. In the same manner, the semiconductor apparatus 300 may provide a capacitor to the terminal of each component that receives the operating power source. For example, the semiconductor apparatus 300 includes a capacitor between the power source input of the latch section 440 and the reference potential. The semiconductor apparatus 300 further includes a capacitor having one end connected between the latch section 440 and the second rectifying element 620 and the other end connected to the second terminal 106, for example. In this way, the latch section 440 can stably receive the operating power source.

The semiconductor apparatus 300 according to the present embodiment described above is an example in which the switch element operates as an n-channel type. When such a semiconductor apparatus 300 is formed on a substrate, this n-channel switch element is preferably formed with substantially the same arrangement. For example, when a vertical semiconductor switch is formed on a substrate, a collector terminal is formed on one surface of the substrate and a gate terminal and emitter terminal are formed on the other surface of the substrate. As an example, the power semiconductor element 110 includes a collector terminal on the first terminal side provided on a first surface side of the substrate, a gate terminal provided on a second surface side of the substrate, and an emitter terminal on the second terminal side provided on the second surface side of the substrate.

In this case, the second surface side of the substrate has n-type conductivity. Accordingly, the switch element 310 and the OFF potential supplying section 340 are preferably n-channel MOSFETs formed on the second surface side of the substrate. In other words, the switch element 310 and the OFF potential supplying section 340 are preferably provided on the second surface side of the substrate. The switch element 210, the potential switching section 230, the switch element 510, and the switch element 520 may also be formed on the second surface side of the substrate, in the same manner.

In this way, the first terminal 104 on the collector terminal side of the power semiconductor element 110 is provided on the first surface side of the substrate. Therefore, the ON potential supplying section 320 connected between the first terminal 104 and the gate of the switch element 310 supplies the ON potential from the first terminal 104 on the first surface side of the substrate to the gate terminal on the second surface side. In this case, the resistor 324 of the ON potential supplying section 320 is preferably formed from the first surface side of the substrate toward the second surface side, and the rectifying element 322 is preferably formed on the second surface side.

The resistor 324 is formed by an n-channel MOSFET, for example, in the same manner as the switch element 310 and the like. In other words, the resistor 324 is, for example, a semiconductor element that includes a collector terminal that also serves as the collector terminal of the power semiconductor element 110 and is provided on the first surface side of the substrate and a gate terminal and emitter terminal provided on the second surface side of the substrate, with the gate terminal and the emitter terminal being electrically connected to each other. This semiconductor element functions as a resistor between the collector terminal and the emitter terminal, and can therefore be used as the resistor 324. In this case, for example, the latch section 440 of the semiconductor apparatus 300 according to the fifth modification receives the power source supply via this semiconductor element from the first terminal 104.

In this way, by forming at least four transistors of the same type on the substrate, the power semiconductor element 110, the switch element 310, the OFF potential supplying section 340, and the resistor 324 can be formed. Accordingly, at least a portion of the process for forming the power semiconductor element 110, the switch element 310, the OFF potential supplying section 340, and the resistor 324 can be performed in common, and the semiconductor apparatus 300 manufacturing process can be made more efficient. If the first surface side and the second surface side are electrically connected to each other in an end, a portion, or the like of the substrate, the resistor 324 may be formed on the first surface side or the second surface side of this substrate.

Figure 14:
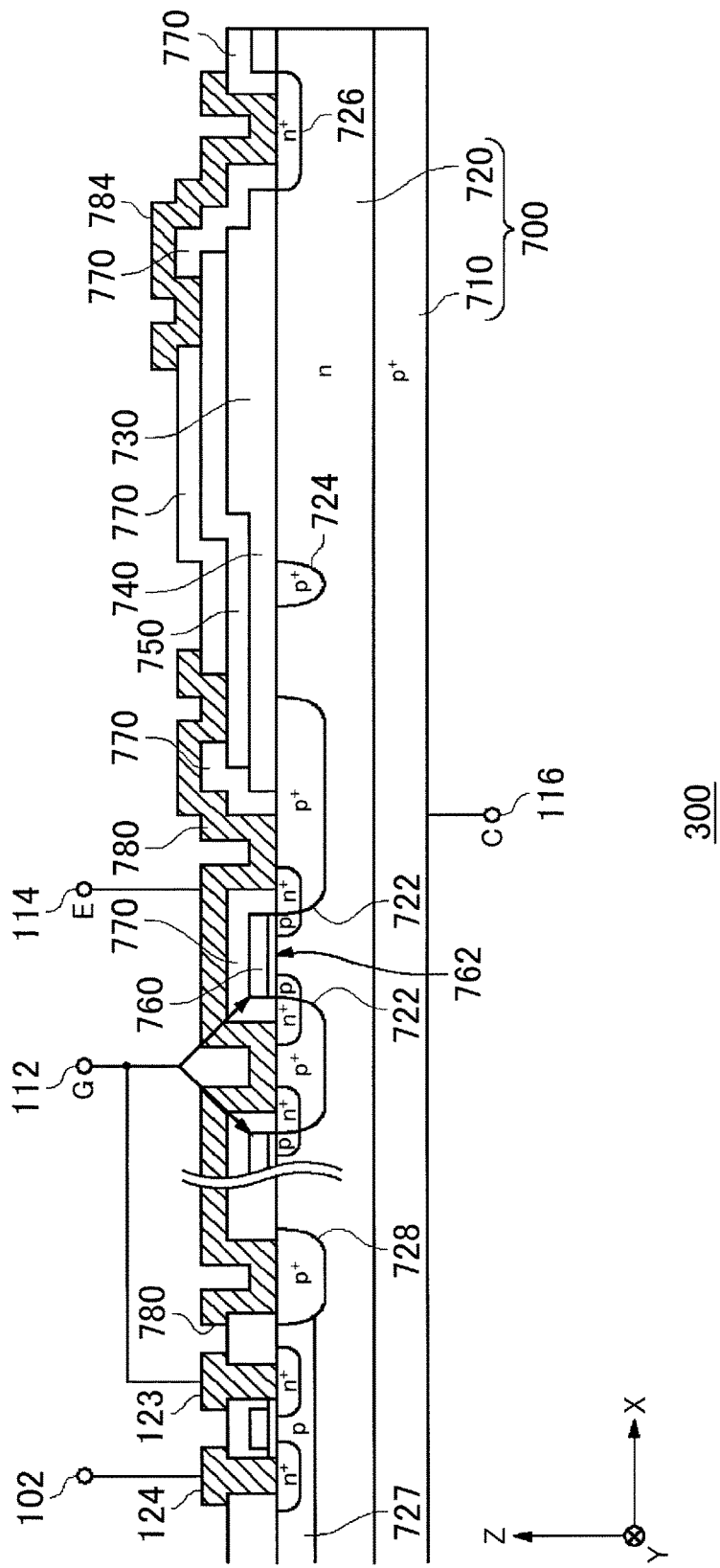
FIG. 14 shows an exemplary configuration of a portion of a substrate on which the semiconductor apparatus 300 is formed, according to an embodiment.

An example in which the semiconductor apparatus 300 according to the present embodiment is formed on a substrate in the manner described above is described using FIG. 14. FIG. 14 shows an exemplary configuration of a portion of a substrate 700 on which the semiconductor apparatus 300 according to the present embodiment is formed. FIG. 14 shows an example of a cross-sectional structure of the switch element 310 formed as an n-channel MOSFET and the power semiconductor element 110 provided in the semiconductor apparatus 300. Specifically, the power semiconductor element 110 includes the collector terminal 116 formed on the first surface side of the substrate 700 and the gate terminal 112 and emitter terminal 114 formed on the second surface side of the substrate 700. The switch element 310 formed by an n-channel MOSFET includes a source electrode 123 and a drain electrode 124 on the second surface side of the substrate 700. The semiconductor apparatus 300 switches between having an electrical connection and having no electrical connection in the vertical direction (Z direction) between the emitter terminal 114 and the collector terminal 116, in response to the control signal input to the gate terminal 112.

The semiconductor apparatus 300 is formed on the substrate 700. The substrate 700 is provided with an n-type layer region 720 on the second surface side of a (p+)-type layer region 710. The substrate 700 is a silicon substrate, for example. The n-type layer region 720 in the substrate 700 is formed by injecting impurities such as phosphorous or arsenic into the second surface side of the p-type substrate that has been doped with boron or the like. FIG. 14 shows an example in which the surface of the substrate 700 facing the −Z direction is the first surface and this first surface is substantially parallel to the XY plane. Furthermore, FIG. 14 shows an exemplary configuration of a cross section of the semiconductor apparatus 300 in the XZ plane, which is substantially perpendicular to the first surface. The collector terminal 116 is formed on the (p+)-type layer region 710 side of the substrate 700. A collector electrode may be further formed on the first surface side of the substrate 700.

A first well region 722, a second well region 724, a third well region 726, a fourth well region 727, and a fifth well region 728 are formed in the n-type layer region 720. The first well region 722 has an emitter region of the power semiconductor element 110 formed therein. A plurality of the first well regions 722 are formed in the n-type layer region 720. Each first well region 722 is formed as a region with (p+)-type conductivity, and the emitter region that is an (n+)-type region is formed in this (p+)-type region, for example. Each first well region 722 is connected to the emitter terminal 114 along with the emitter region. Each first well region 722 may be formed adjacent to a p-type region having a lower impurity concentration than the first well region 722, for example.

The second well region 724 is formed closer to an end of the substrate 700 than the first well regions 722 and is electrically insulated from the first well regions 722. The second well region 724 is formed in a manner to surround the region formed by the first well regions 722 in the second surface side of the substrate 700, for example. The second well region 724 is formed with a ring shape, for example. The second well region 724 is formed as a region with (p+)-type conductivity, for example. The second well region 724 forms a depletion layer due to the pn junction with the n-type layer region 720 surrounding the periphery of the second well region 724, and prevents carriers caused by high voltage or the like added to the substrate 700 from flowing to the first well region 722 side. The third well region 726 is formed on the outer periphery of the substrate 700 and is electrically connected to the collector terminal 116.

The fourth well region 727 is a region where transistor elements and the like other than the power semiconductor element 110 are formed. The fourth well region 727 is formed as a region with (p+)-type conductivity, for example. A source region and a drain region, which are (n+)-type regions forming the n-channel MOSFET serving as the switch element 310, are formed in this (p+)-type region. The gate of the switch element 310 is formed between the source region and the drain region. The fifth well region 728 is formed to surround the fourth well region 727. The fifth well region 728 is formed as a region with (p+)-type conductivity, for example. The fourth well region 727 may be formed to have a lower impurity concentration than the fifth well region 728, for example.

A first insulating film 730, a second insulating film 740, a semiconductor film 750, a gate electrode 760, a third insulating film 770, an emitter electrode 780, and an electrode portion 784 are formed and layered on the second surface of the n-type layer region 720. The first insulating film 730 and the second insulating film 740 are formed on the second surface side of the n-type layer region 720. The first insulating film 730 and the second insulating film 740 include oxide films, for example. The first insulating film 730 and the second insulating film 740 include silicon oxide, for example. The second insulating film 740 contacts the first insulating film 730 and is formed to be thinner than the first insulating film 730.

The semiconductor film 750 is formed on the top surfaces of the first insulating film 730 and the second insulating film 740, one end of the semiconductor film 750 is connected to the emitter electrode 780, and the other end of the semiconductor film 750 is connected to the third well region 726. The semiconductor film 750 is formed of polysilicon, for example. The semiconductor film 750 may have a resistor, a diode, and/or the like formed therein. Specifically, the semiconductor film 750 is formed between the gate terminal 112 and the emitter terminal 114.

The gate electrode 760 is connected to the gate terminal 112. A gate insulating film 762 is formed between the gate electrode 760 and the n-type layer region 720. The third insulating film 770 electrically insulates the electrode portion 784 from the emitter electrode 780 layered after the formation of this third insulating film 770. The third insulating film 770 is a borophosphosilicate glass (BPSG), for example. The third insulating film 770 has a contact hole formed therein through etching to expose a portion of the substrate 700.

The emitter electrode 780 is an electrode formed in contact with the first well regions 722. The emitter electrode 780 is formed in the contact hole formed in the third insulating film 770, for example. When a plurality of the first well regions 722 are formed in the semiconductor apparatus 300, the emitter electrode 780 is formed in contact with the plurality of first well regions 722. At least a portion of the emitter electrode 780 is the emitter terminal 114, for example. At least a portion of the emitter electrode 780 may be formed as an electrode pad. When the semiconductor apparatus 300 is housed in a package or the like, at least a portion of the emitter electrode 780 is electrically connected to a terminal provided in this package by wire bonding or the like.

The electrode portion 784 electrically connects the third well region 726 and the semiconductor film 750. The electrode portion 784 is formed in the contact hole formed in the third insulating film 770 and contacts the third well region 726, for example In the manner described above, FIG. 14 shows an example in which the power semiconductor element 110 and the switch element 310 are formed on the substrate 700 serving as an n-channel switch. The OFF potential supplying section 340 may be formed as an n-channel MOSFET on the second surface side of the substrate, in the same manner as in the example of FIG. 14.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor apparatus comprising:
   a power semiconductor element that is connected between a first terminal on a high potential side and a second terminal on a low potential side, and is controlled to be ON or OFF according to a gate potential thereof;
   a switch element that is connected between a control terminal that inputs a control signal for controlling the power semiconductor element and a gate of the power semiconductor element, and is controlled to be ON or OFF according to a gate potential thereof;
   an ON potential supplying section that is connected between the first terminal and a gate of the switch element, and supplies an ON potential to the gate of the switch element;
   an OFF potential supplying section that is connected between a reference potential and the gate of the switch element, and sets the gate potential of the switch element to an OFF potential in response to a predetermined cutoff condition being satisfied;
   wherein the ON potential supplying section includes:
   a pullup circuit that includes a rectifying element connected between the first terminal and the gate of the switch element, and pulls up the gate of the switch element with a voltage from the first terminal; and
   a capacitor that is provided between the gate of the switch element and a reference potential or the control terminal.

2. The semiconductor apparatus according to claim 1, wherein
   the ON potential supplying section pulls up the gate of the switch element, and
   the OFF potential supplying section connects the gate of the switch element to the reference potential, in response to the predetermined cutoff condition being satisfied.

3. The semiconductor apparatus according to claim 1, wherein
   the pullup circuit includes a resistor connected in series with the rectifying element, closer to the first terminal than the rectifying element, between the first terminal and the gate of the switch element.

4. The semiconductor apparatus according to claim 1, comprising:
   a discharge circuit that is connected between the gate of the power semiconductor element and the reference potential, and discharges a charge that has been accumulated in the gate of the power semiconductor element.

5. The semiconductor apparatus according to claim 1, wherein
   the power semiconductor element includes a collector terminal on the first terminal side provided on a first surface side of a substrate, a gate terminal provided on a second surface side of the substrate, and an emitter terminal on the second terminal side provided on the second surface side of the substrate, the second surface side of the substrate has n-type conductivity, and
   the switch element is an n-channel MOSFET formed on the second surface side of the substrate.

6. The semiconductor apparatus according to claim 1, wherein
   the semiconductor apparatus is an ignitor that controls a current flowing through an ignition coil according to a control signal from outside.

7. A semiconductor apparatus comprising:
   a power semiconductor element that is connected between a first terminal on a high potential side and a second terminal on a low potential side, and is controlled to be ON or OFF according to a gate potential thereof;
   a switch element that is connected between a control terminal that inputs a control signal for controlling the power semiconductor element and a gate of the power semiconductor element, and is controlled to be ON or OFF according to a gate potential thereof;
   an ON potential supplying section that is connected between the first terminal and a gate of the switch element, and supplies an ON potential to the gate of the switch element;
   an OFF potential supplying section that is connected between a reference potential and the gate of the switch element, and sets the gate potential of the switch element to an OFF potential in response to a predetermined cutoff condition being satisfied;
   a cutoff condition detecting section that detects whether the predetermined cutoff condition has been satisfied; and
   a latch section that latches affirmative detection of the cutoff condition, wherein
   the OFF potential supplying section sets the gate potential of the switch element to the OFF potential, in response to the latch section having latched the cutoff condition as being satisfied.

8. The semiconductor apparatus according to claim 7, wherein
   the latch section receives a power source supply from the first terminal and holds a latched value.

9. The semiconductor apparatus according to claim 8, wherein
   the latch section receives the power source supply from the control terminal and the first terminal, and holds the latched value.

10. A semiconductor apparatus comprising:
    a power semiconductor element that is connected between a first terminal on a high potential side and a second terminal on a low potential side, and is controlled to be ON or OFF according to a gate potential thereof;
    a cutoff condition detecting section that detects whether a predetermined cutoff condition has been satisfied;
    a latch section that latches affirmative detection of the cutoff condition; and
    a cutoff section for setting the gate potential of the power semiconductor element to an OFF potential, in response to the latch section having latched the affirmative detection of the cutoff condition, wherein
    the latch section receives a power source supply from the first terminal and holds a latched value.

11. The semiconductor apparatus according to claim 10, wherein
    the latch section receives the power source supply from the first terminal and a control terminal that inputs a control signal for controlling the power semiconductor element.

12. The semiconductor apparatus according to claim 11, wherein
the latch section receives the power source supply from the control terminal via a first rectifying element, and receives the power source supply from the first terminal via a second rectifying element.

13. The semiconductor apparatus according to claim 10, further comprising:
a switch element that is connected between a control terminal that inputs a control signal for controlling the power semiconductor element and a gate of the power semiconductor element, and is controlled to be ON or OFF according to a gate potential thereof; and
an ON potential supplying section that is connected between the first terminal and the gate of the switch element, and supplies an ON potential to the gate of the switch element, wherein
the cutoff section includes an OFF potential supplying section that is connected between a reference potential and the gate of the switch element, and sets the gate potential of the switch element to the OFF potential in response to a predetermined cutoff condition being satisfied.

14. The semiconductor apparatus according to claim 10, wherein
the power semiconductor element includes a collector terminal on the first terminal side provided on a first surface side of a substrate, a gate terminal provided on a second surface side of the substrate, and an emitter terminal on the second terminal side provided on the second surface side of the substrate,
the semiconductor apparatus includes a semiconductor element having a collector terminal shared with the collector terminal of the power semiconductor element and provided on the first surface side of the substrate and an emitter terminal and a gate terminal that are electrically connected to each other and provided on the second surface side of the substrate, and
the latch section receives the power source supply via the semiconductor element from the first terminal.

\* \* \* \* \*